US012565419B2

(12) United States Patent
Yalamarthy et al.

(10) Patent No.: US 12,565,419 B2
(45) Date of Patent: Mar. 3, 2026

(54) CRASH MITIGATION IN ACTIVE MEMS COOLING SYSTEMS

(71) Applicant: Frore Systems Inc., San Jose, CA (US)

(72) Inventors: Ananth Saran Yalamarthy, San Jose, CA (US); Vikram Mukundan, San Ramon, CA (US); Suryaprakash Ganti, Los Altos, CA (US); Sangkyu Kim, San Jose, CA (US); Seshagiri Rao Madhavapeddy, La Jolla, CA (US); Prathima Kapa, Dublin, CA (US)

(73) Assignee: Frore Systems Inc., San Jose, CA (US)

( * ) Notice: Subject to any disclaimer, the term of this patent is extended or adjusted under 35 U.S.C. 154(b) by 0 days.

(21) Appl. No.: 19/199,129

(22) Filed: May 5, 2025

(65) Prior Publication Data

US 2025/0340431 A1 Nov. 6, 2025

Related U.S. Application Data

(60) Provisional application No. 63/643,310, filed on May 6, 2024.

(51) Int. Cl.
B81B 7/00 (2006.01)
H01L 23/46 (2006.01)
(52) U.S. Cl.
CPC ............ B81B 7/0016 (2013.01); H01L 23/46 (2013.01); B81B 2201/058 (2013.01); B81B 2203/0118 (2013.01); B81B 2203/0307 (2013.01); B81B 2203/0315 (2013.01); B81B 2203/0361 (2013.01)

(58) Field of Classification Search
None
See application file for complete search history.

(56) References Cited

U.S. PATENT DOCUMENTS

| | | | |
|---|---|---|---|
| 6,232,680 B1 | 5/2001 | Bae | |
| 2021/0176895 A1* | 6/2021 | Mukundan | H05K 7/20254 |
| 2021/0183739 A1 | 6/2021 | Sathyamurthy | |
| 2021/0277883 A1 | 9/2021 | Tanaka | |
| 2022/0087058 A1* | 3/2022 | Sankar | H05K 7/20309 |
| 2023/0016991 A1 | 1/2023 | Mukundan | |

FOREIGN PATENT DOCUMENTS

EP 2983287 2/2016

* cited by examiner

*Primary Examiner* — Moazzam Hossain

(74) *Attorney, Agent, or Firm* — Van Pelt, Yi & James LLP

(57) ABSTRACT

A fluid transfer system is described. The fluid transfer system includes an active element, a structural element coupled with the active element, and a cushion. The active element has a leading edge and is configured to undergo vibrational motion. The cushion is between the leading edge of the active element and a portion of the structural element. The cushion mitigates collisions between the portion of the structural element and the leading edge of the active element.

17 Claims, 11 Drawing Sheets

100

100

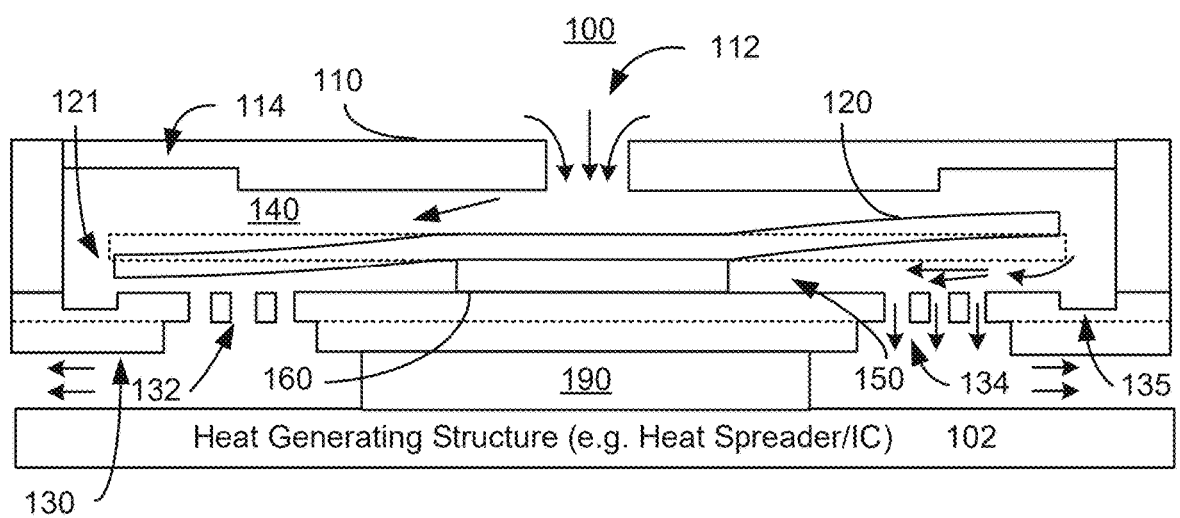
FIG. 1E
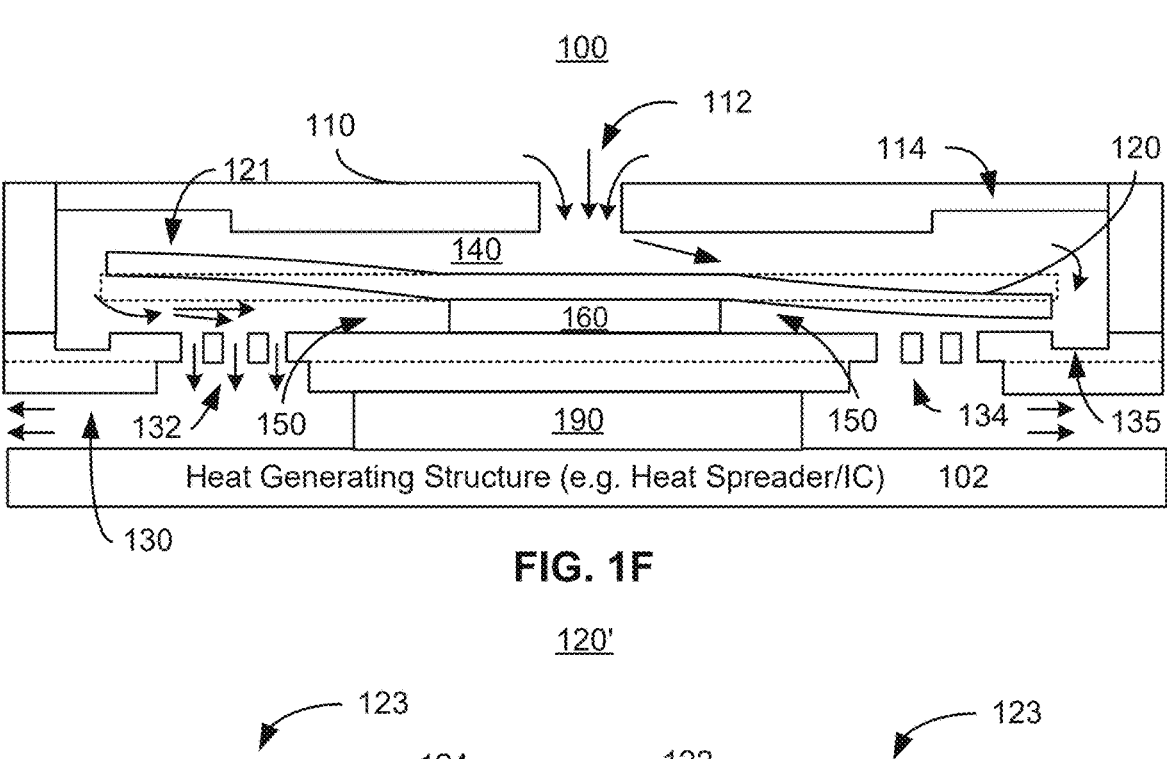
FIG. 1F
FIG. 1G

300

CRASH MITIGATION IN ACTIVE MEMS COOLING SYSTEMS

CROSS REFERENCE TO OTHER APPLICATIONS

This application claims priority to U.S. Provisional Patent Application No. 63/643,310 entitled CRASH MITIGATION FOR ACTIVE MEMS COOLING SYSTEMS filed May 6, 2024 which is incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through larger computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool not only mobile devices and larger devices, but may also be inadequate for high power computing systems, such as server systems. In addition to the ability to cool the other aspects of the cooling system may also be desirable. For example, cooling the computing device is desired to not add significantly to the noise produced by the device. Consequently, additional cooling solutions for computing devices, particularly high power dissipation computing devices, are desired.

BRIEF DESCRIPTION OF THE DRAWINGS

Various embodiments of the invention are disclosed in the following detailed description and the accompanying drawings.

FIGS. 1A-1G depict an embodiment of an active MEMS cooling system including a centrally anchored cooling element.

DETAILED DESCRIPTION

Figure 1A:
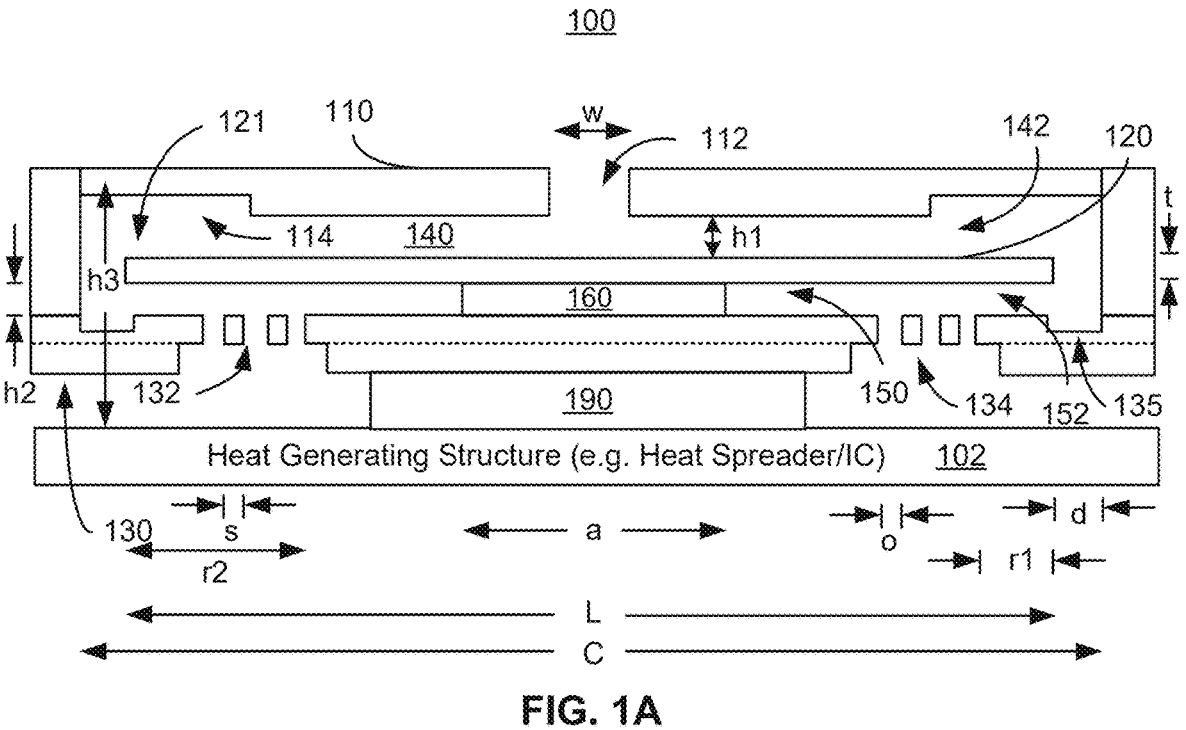

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebooks, and virtual reality devices can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated.

Larger devices, such as laptop or desktop computers, often include electric fans that have rotating blades. The fan that can be energized in response to an increase in temperature of internal components. The fans drive air through the larger devices to cool internal components. However, such fans are not only too large for some devices, but also may have limited efficacy because of the boundary layer of air existing at the surface of the components, because of a low backpressure when to drive air through devices, because of a limited speed for air flow across the hot surface desired to be cooled, and because of the excessive amount of noise that may be generated. Moreover, the fans used to cool larger devices such as laptops are audible. In some instances, the amount of noise produced by such fans is undesirable.

Passive cooling solutions may include components such as a heat spreader and a heat pipe or vapor chamber to transfer heat to a heat exchanger. Such passive cooling systems do not generate noise. However, such passive cooling devices may not be sufficient to mitigate heat in some systems. For example, a heat pipe or vapor chamber may provide an insufficient amount of heat transfer to remove excessive heat generated. These issues may be exacerbated for high power systems, such as server and/or machine learning systems, that generate a significant amount of heat. Thus, improved techniques for providing heat dissipation, particularly in high power dissipation systems, are still desired.

A fluid transfer system is described. The fluid transfer system includes an active element, a structural element coupled with the active element, and a cushion. The active element has a leading edge and is configured to undergo vibrational motion. The cushion is between the leading edge of the active element and a portion of the structural element. The cushion mitigates collisions between the portion of the structural element and the leading edge of the active element.

In some embodiments, the cushion is coupled with the leading edge of the active element. In some embodiments, the cushion is coupled with the structural element. In some embodiments, the active element includes a tip region, which includes a portion of the leading edge. The cushion is coupled to the structural element. A portion of the cushion is aligned with the portion of the leading edge. In some embodiments, the structural element may include an orifice plate having a cavity therein. The cushion may be in the cavity. In some embodiments, the cushion occupies a portion of the cavity such that a recess is between the cushion and an outer region of the orifice plate. In some such embodiments, the cushion may occupy the portion of the cavity such that an additional recess is between the cushion and a central region of the orifice plate. In some embodiments, the orifice plate includes an upper plate and a lower plate. The cavity may include an aperture in the upper plate. In such embodiments, the cushion may be coupled with a portion of the lower plate aligned with the aperture.

In some embodiments, the active element includes a tip. The structural element includes an orifice plate having a cavity therein. The tip extends over a portion of the cavity. In some embodiments, the cushion has a Shore A hardness of not more than ninety.

A fluid transfer system includes a plurality of cooling cells and a plurality of cushions. Each cooling cell includes a chamber having an active element therein. The active element has a leading edge and is configured to undergo vibrational motion. The chamber includes a structural element. A cushion of the plurality of cushions is in a cooling cell of the plurality of cooling cells. The cushion is configured to mitigate collisions between the leading edge of the active element and the structural element of the chamber.

In some embodiments, the cushion is coupled with the leading edge of the active element. In some embodiments, the active element includes a tip region having a portion of the leading edge. In such embodiments, the cushion is coupled to the structural element. A portion of the cushion is aligned with the portion of the leading edge.

The structural element may include an orifice plate having a cavity therein. The cushion is in the cavity. In some embodiments, the cushion occupies a portion of the cavity such that a recess is between the cushion and an outer region of the orifice plate. In some embodiments, the cushion occupies the portion of the cavity such that an additional recess is between the cushion and a central region of the orifice plate. The orifice plate may include an upper plate and a lower plate. The cavity includes an aperture in the upper plate. In addition, the cushion is coupled with a portion of the lower plate aligned with the aperture. The active element may include a tip. The structural element includes an orifice plate having a cavity therein. The tip extends over a portion of the cavity.

A method is described. An active element is driven to induce a vibrational motion at a frequency. The active element is in a chamber of a fluid transfer system. The active element has a leading edge and is configured to undergo the vibrational motion when activated. The vibrational motion drives the fluid through the chamber. The chamber includes a structural element. A cushion is between the leading edge of the active element and a portion of the structural element. The cushion mitigates collisions between the portion of the structural element and the leading edge of the active element. In some embodiments, the cushion is coupled to the leading edge of the active element. In some embodiments, the active elements include a tip region having a portion of the leading edge. In such embodiments, the cushion is coupled to the structural element. A portion of the cushion is aligned with the portion of the leading edge.

Figure 1B:
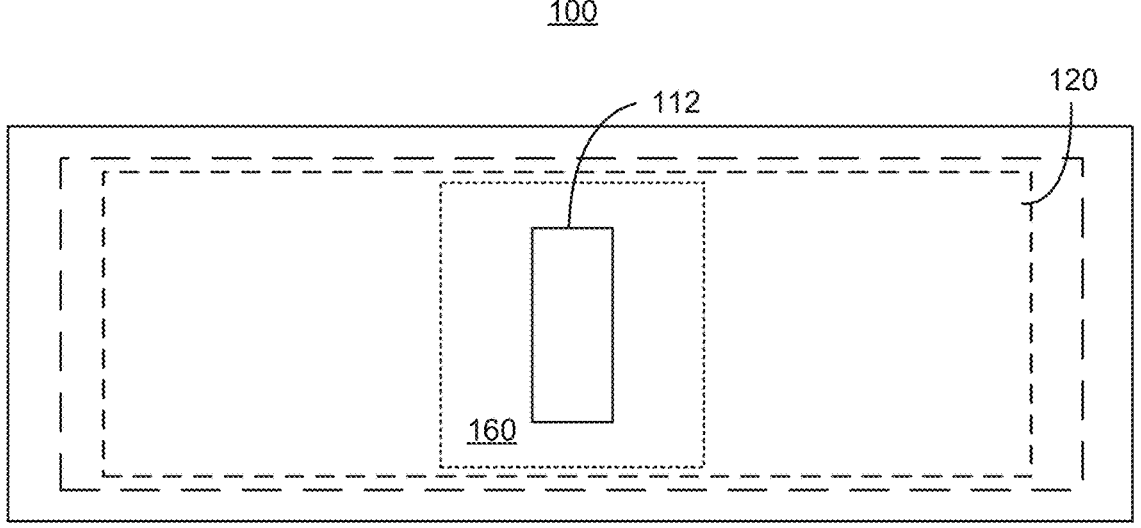
Figure 1C:
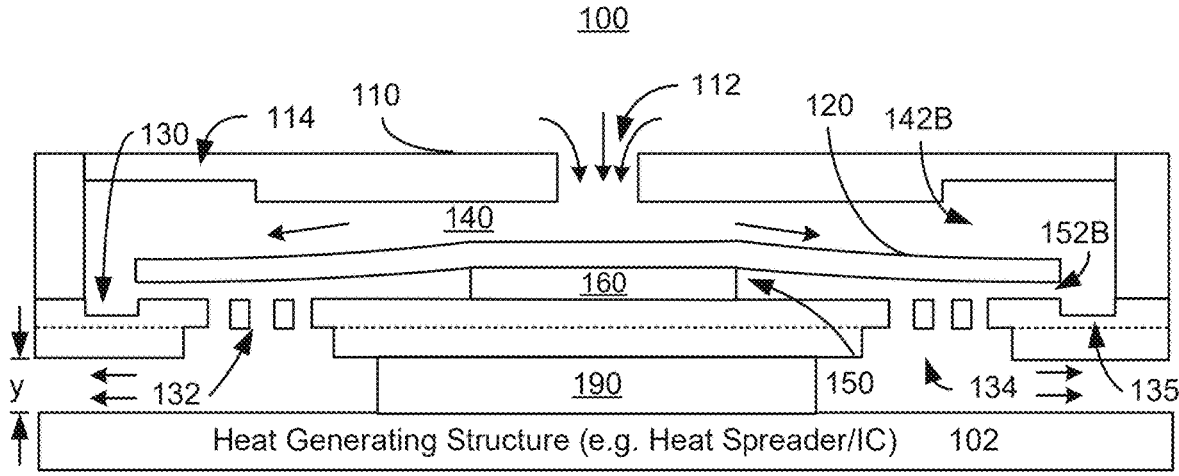
Figure 1D:
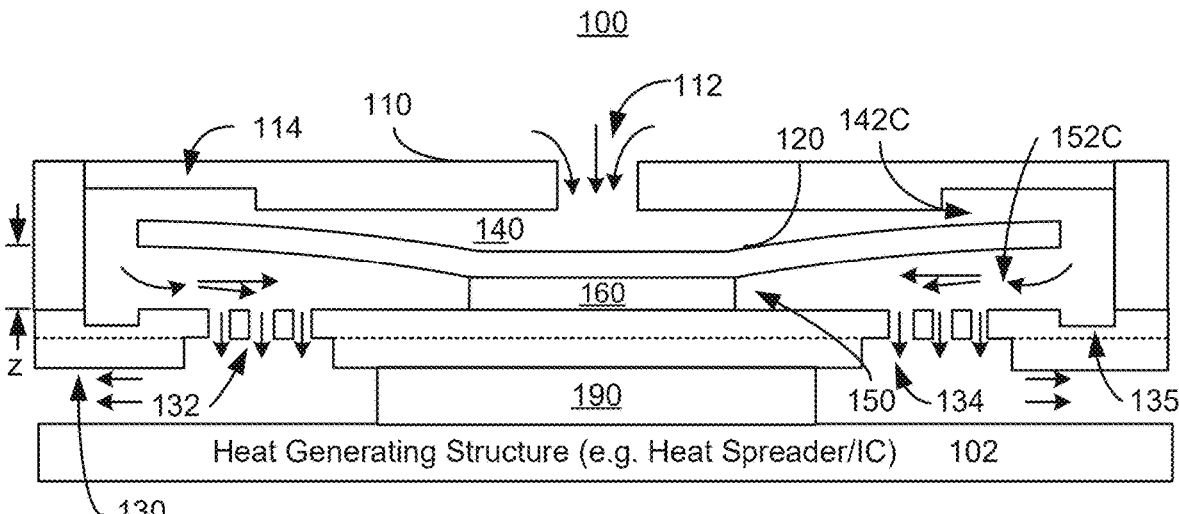

FIGS. 1A-1G are diagrams depicting an exemplary embodiment of active MEMS cooling system 100 usable with heat-generating structure 102 and including a centrally anchored cooling element 120 or 120'. Although termed a cooling system, MEMS system 100 and analogous systems described herein may be considered heat transfer systems and/or fluid transfer systems. Cooling element 120 is shown in FIGS. 1A-1F and cooling element 120' is shown in FIG. 1G. For clarity, only certain components are shown. FIGS. 1A-1G are not to scale. FIGS. 1A and 1B depict cross-sectional and top views of cooling system 100 in a neutral position. FIGS. 1C-1D depict cooling system 100 during actuation for in-phase vibrational motion. FIGS. 1E-1F depict cooling system 100 during actuation for out-of-phase vibrational motion. Although shown as symmetric, cooling system 100 need not be.

Cooling system 100 includes top plate 110 having vent 112 and cavities 114 therein, cooling element 120, orifice plate 130 having orifices 132 and cavities 134 and 135 therein, support structure (or "anchor") 160 and chambers 140 and 150 (collectively chamber 140/150) formed therein. Cooling element 120 is supported at its central region by anchor 160. Although termed a cooling element with respect to FIGS. 1A-1G, cooling element 120 and analogous elements described herein may also be considered actuators, vibrating elements, vibrating components, active components, active elements, and/or other terms indicating that the element is configured to undergo vibrational motion when activated (or energized) and/or to drive fluid through a system. Regions of cooling element 120 closer to and including portions of the cooling element's perimeter (e.g. tip 121) vibrate when actuated. In some embodiments, tip 121 of cooling element 120 includes a portion of the perimeter furthest from anchor 160 and undergoes the largest deflection during actuation of cooling element 120. For clarity, only one tip 121 of cooling element 120 is labeled in FIG. 1A. In some embodiments, vibration of portions of cooling element 120 may cause motion (e.g. rotation) of anchor 160. Also shown is pedestal 190 that connects orifice plate 130 to and offsets orifice plate 130 from heat-generating structure 102. In some embodiments, pedestal 190 also thermally couples orifice plate 130 to heat-generating structure 102. In some embodiments, orifice plate 130 may include an upper plate and a lower, jet channel plate. This is indicated by the dashed line in orifice plate 130. Thus, multiple plates and/or plate(s) having various structures may be used at the bottom plate for cooling system 100.

FIG. 1A depicts cooling system 100 in a neutral position. Thus, cooling element 120 is shown as substantially flat. For in-phase operation, cooling element 120 is driven to vibrate between positions shown in FIGS. 1C and 1D. This vibrational motion draws fluid (e.g. air) into vent 112, through chambers 140 and 150 and out orifices 132 at high speed and/or flow rates. The geometry of cooling system 100 may be configured to achieve particular speeds and/or flow rates may for various applications and fluids. For example, the speed at which the fluid (e.g., air) is driven toward heat-generating structure 102 may be at least ten meters per second. In some embodiments, the flow rate through cooling system 100 may be up to approximately 0.08 cubic feet per minute (e.g., at least 0.04 or 0.05 and not more than 0.08 cfm) for air. In some embodiments, the speed may be at least thirty meters per second (e.g. exiting orifices 132 or through the small gap 152B). In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled. In some embodiments, heat-generating structure 102 may be a thermally conductive part of a module containing cooling system 100. For example, cooling system 100 may be affixed to heat-generating structure 102, which may be coupled to another heat spreader, a heatsink, vapor chamber, integrated circuit, or other separate structure desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electro-mechanical system (MEMS) cooling system capable of residing within mobile computing devices and/or other devices having limited space in at least one dimension. For example, the total height, h3, of cooling system 100 (from the top of heat-generating structure 102 to the top of top plate 110) may be less than 2 millimeters. In some embodiments, the total height of cooling system 100 is not more than 1.5 millimeters. In some embodiments, this total height is not more than 1.1 millimeters. In some embodiments, the total height does not exceed one millimeter. In some embodiments, the total height does not exceed two hundred and fifty micrometers. Similarly, the distance between the bottom of orifice plate 130 and the top of heat-generating structure 102, y, may be small. In some embodiments, y is at least two hundred micrometers and not more than 1.2 millimeters. For example, y may be at least two hundred and fifty micrometers and not more than three hundred micrometers. In some embodiments, y is at least five hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas and/or a liquid. For example, the fluid may be air, air combined with liquid vapor, or a liquid. In some embodiments, the fluid includes fluid from outside of the device in which cooling system 100 resides (e.g. provided through external vents in the device). In some embodiments, the fluid circulates within the device in which cooling system 100 resides (e.g. in an enclosed device).

Cooling element 120 can be considered to divide the interior of active MEMS cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. The magnitude of the deflection of cooling element 120 may also be tailored by, for example, changing the driving voltage of the signal used to drive vibration of cooling element 120. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. For example, the height of bottom chamber 150 may be sufficiently large to accommodate the maximum amplitude of vibration of cooling element 120. Thus, no portion of cooling element 120 contacts orifice plate 130 during normal operation in some embodiments. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Top plate 110 also includes cavities 114 therein. Cavities 114 may facilitate vibration of cooling element 120 by moderating the pressure variation near tip of cooling element 120. In other embodiments, cavities 114 may be omitted and top plate 110 may be substantially flat. In some embodiments, other and/or additional trenches and/or other structures may be provided in top plate 110 to modify the configuration of top chamber 140 and/or the region above top plate 110.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A and 1C-1F). In such embodiments, portions of cooling element 120 that vibrate (e.g. including tip 121) move in a cantilevered fashion. Thus, portions of cooling element 120 may move in a manner analogous to the wings of a butterfly (i.e. in phase) and/or analogous to a see-saw (i.e. out of phase). Thus, the portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A and 1C-1F, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A and 1C-1F. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130. Thus, cooling element 120 may be viewed as an actuator. Although described in the context of a single, continuous cooling element, in some embodiments, cooling element 120 may be formed by two (or more) cooling elements. Each of the cooling elements is depicted as one portion pinned (e.g. supported by support structure 160) and an opposite portion unpinned. Thus, a single, centrally supported cooling element 120 may be formed by a combination of multiple cooling elements supported at an edge.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A and 1C-1F) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C, of chamber 140/150 is close to the length, L, of cooling element 120. For example, in some embodiments, the distance, d, between the edge of cooling element 120 and the wall of chamber 140/150 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be a cantilevered section. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is C/2. Thus, C/2=nλ4, where λ is the acoustic wavelength for the fluid and n is odd (e.g. n=1, 3, 5, etc.). For the lowest order mode, C=λ/2. Because the length of chamber 140 (e.g. C) is close to the length of cooling element 120, in some embodiments, it is also approximately true that L/2=nλ/4, where λ is the acoustic wavelength for the fluid and n is odd. Thus, the frequency at which cooling element 120 is driven, v, is at or near the structural resonant frequency for cooling element 120. The frequency v is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency rather than to the acoustic resonant frequency.

Orifice plate 130 has orifices 132 and cavities 134 and 135 therein. Although a particular number and distribution of orifices 132 and cavities 134 and 135 are shown, another number and/or another distribution may be used. Cavities 134 and/or 135 may be configured differently or may be omitted. In some embodiments, other cavities may be within flow chamber 140/150 or the jet channel between orifice plate 130 and heat-generating structure 102. Cavity 135 may assist in capturing dust entering flow chamber 140/150 and/or may enhance fluid flow. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be from substantially zero degrees through a nonzero acute angle from normal to the surface. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as having a particular configuration, other configurations are possible.

The size, number, distribution, and locations of orifices 132 are chosen to control the flow rate of fluid driven to the surface of heat-generating structure 102. The locations and configurations of orifices 132 may be configured to increase the fluid flow from bottom chamber 150 through orifices 132 to the jet channel (the region between the bottom of orifice plate 130 and the top of heat-generating structure 102). The locations and configurations of orifices 132 may also be selected to reduce the suction flow (e.g. back flow) from the jet channel through orifices 132. In some embodiments, the ratio of the flow rate from top chamber 140 into bottom chamber 150 to the flow rate from the jet channel through orifices 132 (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 may be desired to be at least a distance, r1, from tip 121 and not more than a distance, r2, from tip 121 of cooling element 120. In some embodiments, r1 is at least one hundred micrometers (e.g. r1≥100 μm) and r2 is not more than one millimeter (e.g. r2≤1000 μm). In some embodiments, orifices 132 are at least two hundred micrometers from tip 121 of cooling element 120 (e.g. r1≥200 μm). In some such embodiments, orifices 132 are at least three hundred micrometers from tip 121 of cooling element 120 (e.g. r1≥300 μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric material. Cooling element 120 may be driven by a piezoelectric material that is mounted on or integrated into cooling element 120. In some embodiments, cooling element 120 is driven in another manner including but not limited to providing a piezoelectric material on another structure in cooling system 100. Cooling element 120 and analogous cooling elements are referred to hereinafter as piezoelectric cooling elements though it is possible that a mechanism other than a piezoelectric material might be used to drive the cooling element. In some embodiments, cooling element 120 includes a piezoelectric layer on substrate. The substrate may include or consist of stainless steel, a Ni alloy, Hastelloy, Al (e.g. an Al alloy), and/or Ti (e.g. a Ti alloy such as Ti6Al-4V). In some embodiments, a piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric material. The substrate functions as an electrode in some embodiments. In other embodiments, a bottom electrode may be provided between the substrate and the piezoelectric layer. Other layers including but not limited to seed, capping, passivation, or other layers might be included in the piezoelectric cooling element. Thus, cooling element 120 may be actuated using a piezoelectric material.

In some embodiments, cooling system 100 includes chimneys (not shown) and/or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure

102. Thus, the fluid is allowed to carry away heat from heat-generating structure 102.

Operation of cooling system 100 is described in the context of FIGS. 1A and 1C-1F. Although described in the context of particular pressures, gap sizes, and timing of flow, operation of cooling system 100 is not dependent upon the explanation herein. FIGS. 1C-1D depict in-phase operation of cooling system 100. Referring to FIG. 1C, cooling element 120 has been actuated so that its tip 121 moves away from top plate 110. FIG. 1C can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. Because top chamber 140 increases in size, a lower pressure is present in top chamber 140. Because bottom chamber 150 has decreased in size, a higher pressure is present at gap 152B.

Cooling element 120 is also actuated so that tip 121 moves away from heat-generating structure 102 and toward top plate 110. FIG. 1D can thus be considered to depict the end of an up stroke of cooling element 120. Because of the motion of cooling element 120, gap 142 has decreased in size and is shown as gap 142C. Gap 152 has increased in size and is shown as gap 152C. Thus, a higher pressure is present near gap 142C, while a lower pressure is present near gap 152C. The net motion of fluid through chamber 140/150 is indicated in FIGS. 1C and 1D by unlabeled arrows. However, the unlabeled arrows in FIGS. 1C and 1D are not intended to indicate the motion of fluid at a particular time. Thus, cooling system 100 is able to drive fluid from top chamber 140 to bottom chamber 150 without an undue amount of backflow of heated fluid from the jet channel entering bottom chamber 150. Moreover, cooling system 100 may operate such that fluid is drawn in through vent 112 and driven out through orifices 132 without cooling element 120 contacting top plate 110 or orifice plate 130. Thus, pressures are developed within chambers 140 and 150 that effectively open and close vent 112 (e.g., by pressures near gap 142/142B/142C) and orifices 132 (e.g. by pressures near gap 152/152B/152C) such that fluid is driven through cooling system 100 as described herein.

The motion between the positions shown in FIGS. 1C and 1D is repeated. Thus, cooling element 120 undergoes vibrational motion indicated in FIGS. 1A-1D, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz. In some embodiments, cooling element vibrates at a frequency of at least 23 kHz and not more than 26 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid travels along the surface of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to the distal side of top plate 110 after cooling. In other embodiments, heated fluid is carried away and replaced by new fluid at the distal side of cooling element 120. As a result, heat-generating structure 102 may be cooled.

FIGS. 1E-1F depict an embodiment of active MEMS cooling system 100 including centrally anchored cooling element 120 in which the cooling element is driven out-of-phase. More specifically, sections of cooling element 120 on opposite sides of anchor 160 (and thus on opposite sides of the central region of cooling element 120 that is supported by anchor 160) are driven to vibrate out-of-phase. In some embodiments, sections of cooling element 120 on opposite sides of anchor 160 are driven at or near one hundred and eighty degrees out-of-phase. Thus, one section of cooling element 120 vibrates toward top plate 110, while the other section of cooling element 120 vibrates toward orifice plate 130/heat-generating structure 102. Thus, one section of cooling element 120 may carry out an upstroke, while the other section performs a downstroke. Thus, fluid traveling at high speeds (e.g. speeds described with respect to in-phase operation) is alternately driven out of orifices 132 on opposing sides of anchor 160. Because fluid is driven through orifices 132 at high speeds, cooling system 100 may be viewed as a MEMs jet. The net movement of fluid is shown by unlabeled arrows in FIGS. 1E and 1F. However, the unlabeled arrows in FIGS. 1E and 1F are not intended to indicate the motion of fluid at a particular time. The motion between the positions shown in FIGS. 1E and 1F is repeated. Thus, cooling element 120 undergoes vibrational motion indicated in FIGS. 1A, 1E, and 1F, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to the distal side of top plate 110 after cooling. In other embodiments, heated fluid is carried away and replaced by new fluid at the distal side of cooling element 120. As a result, heat-generating structure 102 may be cooled.

Although shown in the context of a uniform cooling element in FIGS. 1A-1F, cooling system 100 may utilize cooling elements having different shapes. FIG. 1G depicts an embodiment of engineered cooling element 120' having a tailored geometry and usable in a cooling system such as cooling system 100. Cooling element 120' includes an anchored region 122 and cantilevered arms 123. Anchored region 122 is supported (e.g. held in place) in cooling system 100 by anchor 160. Cantilevered arms 123 undergo vibrational motion in response to cooling element 120' being actuated. Each cantilevered arm 123 includes step region 124, extension region 126 and outer region 128. In the embodiment shown in FIG. 1G, anchored region 122 is centrally located. Step region 124 extends outward from anchored region 122. Extension region 126 extends outward from step region 124. Outer region 128 extends outward from extension region 126. In other embodiments, anchored region 122 may be at one edge of the actuator and outer region 128 at the opposing edge. In such embodiments, the actuator is edge anchored.

Extension region 126 has a thickness (extension thickness) that is less than the thickness of step region 124 (step thickness) and less than the thickness of outer region 128 (outer thickness). Thus, extension region 126 may be viewed as recessed. Extension region 126 may also be seen as providing a larger bottom chamber 150. In some embodiments, the outer thickness of outer region 128 is the same as the step thickness of step region 124. In some embodiments, the outer thickness of outer region 128 is different from the step thickness of step region 124. In some embodiments, outer region 128 and step region 124 each have a thickness of at least three hundred twenty micrometers and not more than three hundred and sixty micrometers. In some embodiments, the outer thickness is at least fifty micrometers and not more than two hundred micrometers thicker than the extension thickness. Stated differently, the step (difference in step thickness and extension thickness) is at least fifty micrometers and not more than two hundred micrometers. In some embodiments, the outer step (difference in outer thickness and extension thickness) is at least fifty micrometers and not more than two hundred micrometers. Outer region 128 may have a width, q, of at least one hundred micrometers and not more than three hundred micrometers. Extension region 126 has a length, e, extending outward from the step region of at least 0.5 millimeter and not more than 1.5 millimeters in some embodiments. In some embodiments, outer region 128 has a higher mass per unit length in the direction from anchored region 122 than extension region 126. This difference in mass may be due to the larger size of outer region 128, a difference in density between portions of cooling element 120, and/or another mechanism.

Use of engineered cooling element 120' may further improve efficiency of cooling system 100. Extension region 126 is thinner than step region 124 and outer region 128. This results in a cavity in the bottom of cooling element 120' corresponding to extension region 126. The presence of this cavity aids in improving the efficiency of cooling system 100. Each cantilevered arm 123 vibrates towards top plate 110 in an upstroke and away from top plate 110 in a downstroke. When a cantilevered arm 123 moves toward top plate 110, higher pressure fluid in top chamber 140 resists the motion of cantilevered arm 123. Furthermore, suction in bottom chamber 150 also resists the upward motion of cantilevered arm 123 during the upstroke. In the downstroke of cantilevered arm 123, increased pressure in the bottom chamber 150 and suction in top chamber 140 resist the downward motion of cantilevered arm 123. However, the presence of the cavity in cantilevered arm 123 corresponding to extension region 126 mitigates the suction in bottom chamber 150 during an upstroke. The cavity also reduces the increase in pressure in bottom chamber 150 during a downstroke. Because the suction and pressure increase are reduced in magnitude, cantilevered arms 123 may more readily move through the fluid. This may be achieved while substantially maintaining a higher pressure in top chamber 140, which drives the fluid flow through cooling system 100. Moreover, the presence of outer region 128 may improve the ability of cantilevered arm 123 to move through the fluid being driven through cooling system 100. Outer region 128 has a higher mass per unit length and thus a higher momentum. Consequently, outer region 128 may improve the ability of cantilevered arms 123 to move through the fluid being driven through cooling system 100. The magnitude of the deflection of cantilevered arm 123 may also be increased. These benefits may be achieved while maintaining the stiffness of cantilevered arms 123 through the use of thicker step region 124. Further, the larger thickness of outer region 128 may aid in pinching off flow at the bottom of a downstroke. Thus, the ability of cooling element 120' to provide a valve preventing backflow through orifices 132 may be improved. Thus, performance of cooling system 100 employing cooling element 120' may be improved.

Further, cooling elements used in cooling system 100 may have different structures and/or be mounted differently than depicted in FIGS. 1A-1G. In some embodiments, the cooling element may have rounded corners and/or rounded ends but still be anchored along a central axis such that cantilevered arms vibrate. The cooling element may be anchored only at its central region such that the regions surrounding the anchor vibrate in a manner analogous to a jellyfish or the opening/closing of an umbrella. In some such embodiments, the cooling element may be circular or elliptical in shape. In some embodiments, the anchor may include apertures through which fluid may flow. Such an anchor may be utilized for the cooling element being anchored at its top (e.g. to the top plate). Although not indicated in FIGS. 1A-1G, the piezoelectric material utilized in driving the cooling element may have various locations and/or configurations. For example, the piezoelectric material may be embedded in the cooling element, affixed to one side of the cooling element (or cantilevered arm(s)), may occupy some or all of the cantilevered arms, and/or may have a location that is close to or distal from the anchored region. In some embodiments, cooling elements that are not centrally anchored may be used. For example, a pair of cooling elements that have offset apertures, that are anchored at their ends (or all edges), and which vibrate out of phase may be used. Thus, various additional configurations of cooling element 120 and/or 120', anchor 160, and/or other portions of cooling system 100 may be used.

Using the cooling system 100 actuated for in-phase vibration or out-of-phase vibration of cooling element 120 and/or 120', fluid drawn in through vent 112 and driven through orifices 132 may efficiently dissipate heat from heat-generating structure 102. Stated differently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120/120' may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120/120' may not physically contact top plate 110 or orifice plate 130 during vibration in normal operation. Thus, resonance of cooling element 120/120' may be more readily maintained. Issues related to moving away from resonance may be mitigated or avoided through the use of pressure differentials and fluid flow as discussed above. The benefits of improved, quiet cooling may be achieved with limited additional power. Further, out-of-phase vibration of cooling element 120/120' allows the position of the center of mass of cooling element 120/120' to remain more stable. Although a torque is exerted on cooling element 120/120', the force due to the motion of the center of mass is reduced or eliminated. As a result, vibrations due to the motion of cooling element 120/120' may be reduced. Moreover, efficiency of cooling system 100 may be improved through the use of out-of-phase vibrational motion for the two sides of cooling element 120/120'. Consequently, performance of devices incorporating the cooling system 100 may be improved. Further, cooling system 100 may be usable in other applications (e.g. with or without heat-generating structure 102) in which high fluid flows and/or velocities are desired.

In addition, cooling system 100 may have a high back pressure. Back pressure is a measure of the resistance to a fluid flow driven through a system. The back pressure may be considered to be the pressure at which flow through the system goes to zero. Stated differently, the back pressure may be the pressure at which the system can no longer drive fluid flow. Cooling system 100 may have a high back pressure. For example, in some embodiments, the back pressure of cooling system 100 may be on the order of 2 kPa. Depending upon the geometry and fluid used, higher back pressures may be possible. For example, the back pressure of cooling system 100 may be on the order of 6-11 kPa in some embodiments. In some embodiments, the back pressure of cooling system 100 may be 8-10 kPa. As such, system 100 may be capable of driving fluid, and cooling heat-generating structure 102, even at higher pressures (e.g., 2 kPa, 6 kPa, or up to 8-10 kPa).

Figure 2A:
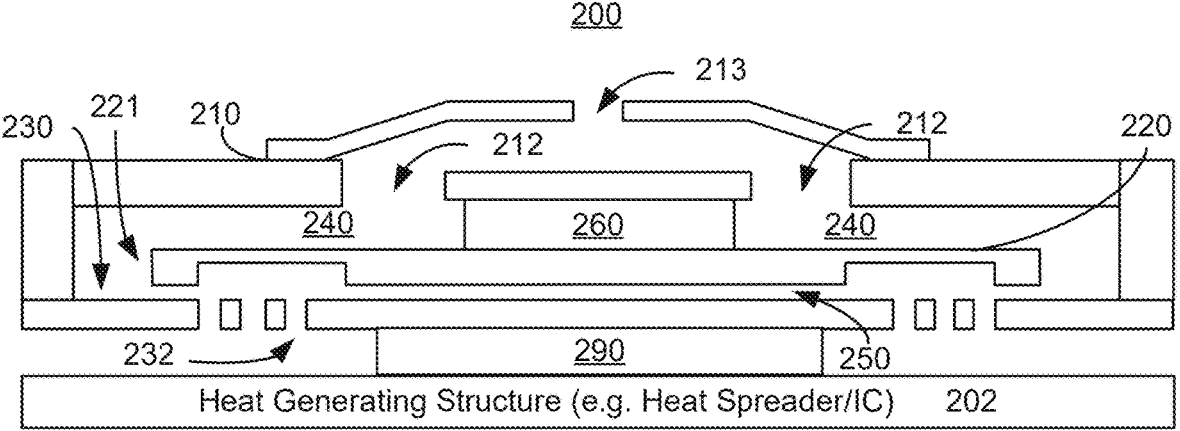
FIGS. 2A-2B depict an embodiment of an active MEMS cooling system including a centrally anchored cooling element.
Figure 2B:
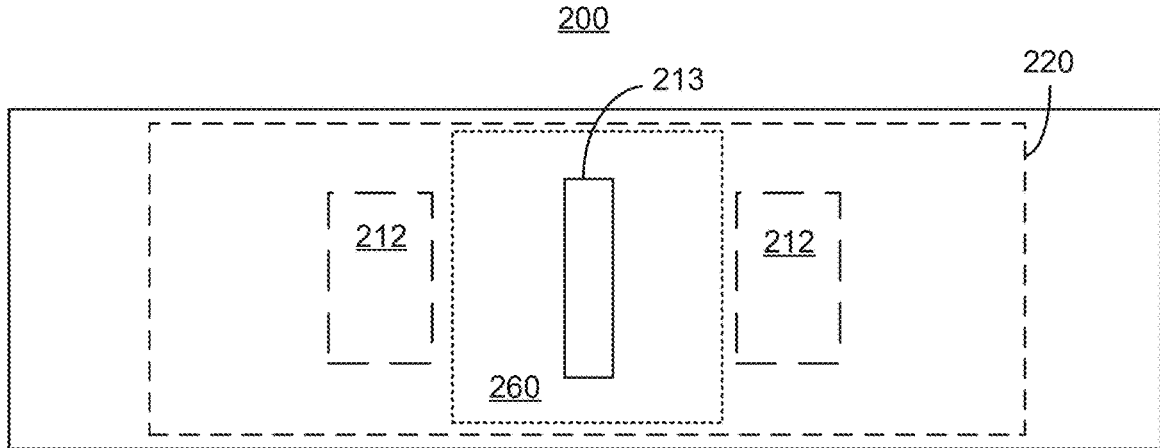

FIGS. 2A-2B depict an embodiment of active MEMS cooling system 200 including a top centrally anchored cooling element. FIG. 2A depicts a side view of cooling system 200 in a neutral position. FIG. 2B depicts a top view of cooling system 200. FIGS. 2A-2B are not to scale. For simplicity, only portions of cooling system 200 are shown. Referring to FIGS. 2A-2B, cooling system 200 is analogous to cooling system 100. Consequently, analogous components have similar labels. For example, cooling system 200 is used in conjunction with heat-generating structure 202, which is analogous to heat-generating structure 102.

Cooling system 200 includes top plate 210 having vents 212, cooling element 220 having tip 221, orifice plate 230 including orifices 232, top chamber 240 having a gap, bottom chamber 250 having a gap, flow chamber 240/250, and anchor (i.e. support structure) 260 that are analogous to top plate 110 having vent 112, cooling element 120 having tip 121, orifice plate 130 including orifices 132, top chamber 140 having gap 142, bottom chamber 150 having gap 152, flow chamber 140/150, and anchor (i.e. support structure) 160, respectively. Also shown is pedestal 290 analogous to pedestal 190. Thus, cooling element 220 is centrally supported by anchor 260 such that at least a portion of the perimeter of cooling element 220 is free to vibrate. In some embodiments, anchor 260 extends along the axis of cooling element 220. In other embodiments, anchor 260 is only near the center portion of cooling element 220. Although not explicitly labeled in FIGS. 2A and 2B, cooling element 220 includes an anchored region and cantilevered arms including step region, extension region, and outer regions analogous to anchored region 122, cantilevered arms 123, step region 124, extension region 126, and outer region 128 of cooling element 120'. In some embodiments, cantilevered arms of cooling element 220 are driven in-phase. In some embodiments, cantilevered arms of cooling element 220 are driven out-of-phase. In some embodiments, a simple cooling element, such as cooling element 120, may be used. Further, although cavities analogous to cavities 134 and 135 are not depicted in cooling system 200, such cavities may be present.

Anchor 260 supports cooling element 220 from above. Thus, cooling element 220 is suspended from anchor 260. Anchor 260 is suspended from top plate 210. Top plate 210 includes vent 213. Vents 212 on the sides of anchor 260 provide a path for fluid to flow into sides of chamber 240.

As discussed above with respect to cooling system 100, cooling element 220 may be driven to vibrate at or near the structural resonant frequency of cooling element 220. Further, the structural resonant frequency of cooling element 220 may be configured to align with the acoustic resonance of chamber 240/250. The structural and acoustic resonant frequencies are generally chosen to be in the ultrasonic range. For example, the vibrational motion of cooling element 220 may be at the frequencies described with respect to cooling system 100. Consequently, efficiency and flow rate may be enhanced. However, other frequencies may be used.

Cooling system 200 operates in an analogous manner to cooling system 100. Cooling system 200 thus shares the benefits of cooling system 100. Thus, performance of a device employing cooling system 200 may be improved. In addition, suspending cooling element 220 from anchor 260 may further enhance performance. In particular, vibrations in cooling system 200 that may affect other cooling cells (not shown) may be reduced. For example, less vibration may be induced in top plate 210 due to the motion of cooling element 220. Consequently, cross talk between cooling system 200 and other cooling systems (e.g. other cells) or other portions of the device incorporating cooling system 200 may be reduced. Thus, performance may be further enhanced.

Figure 3A:
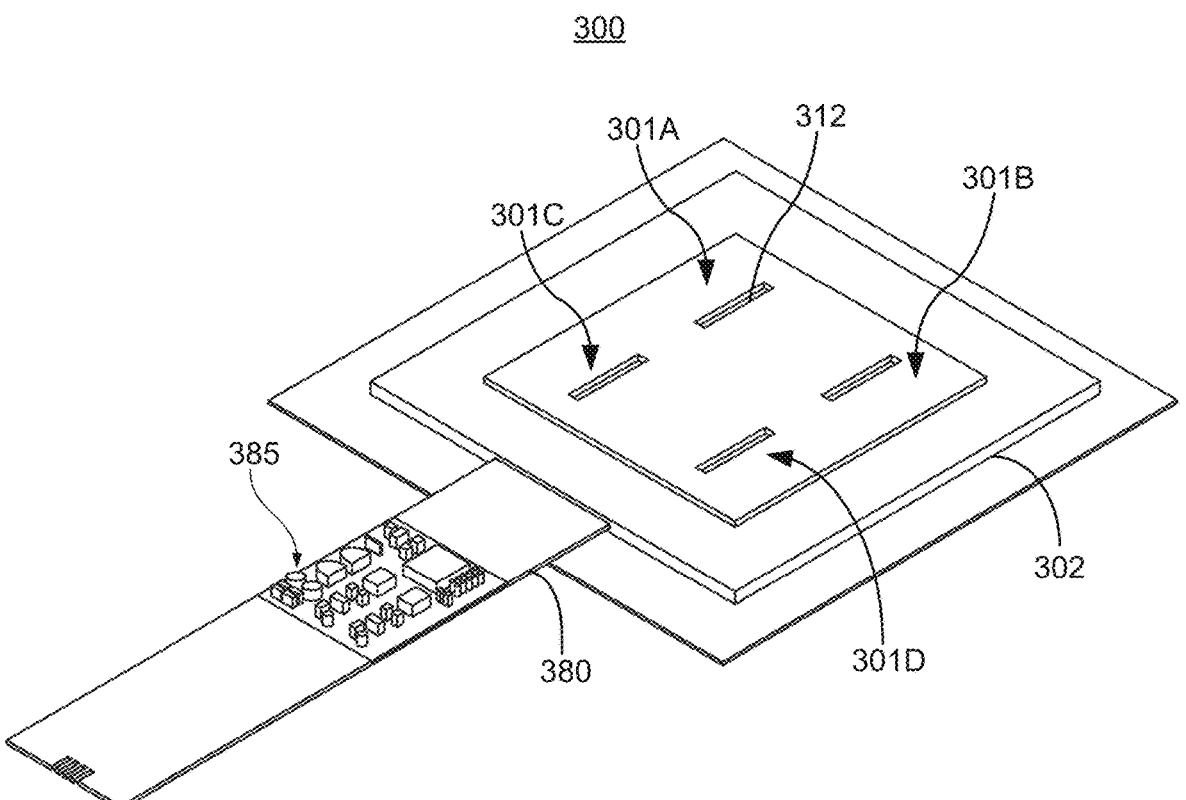
FIGS. 3A-3E depict an embodiment of an active MEMS cooling system formed in a tile.
Figure 3B:
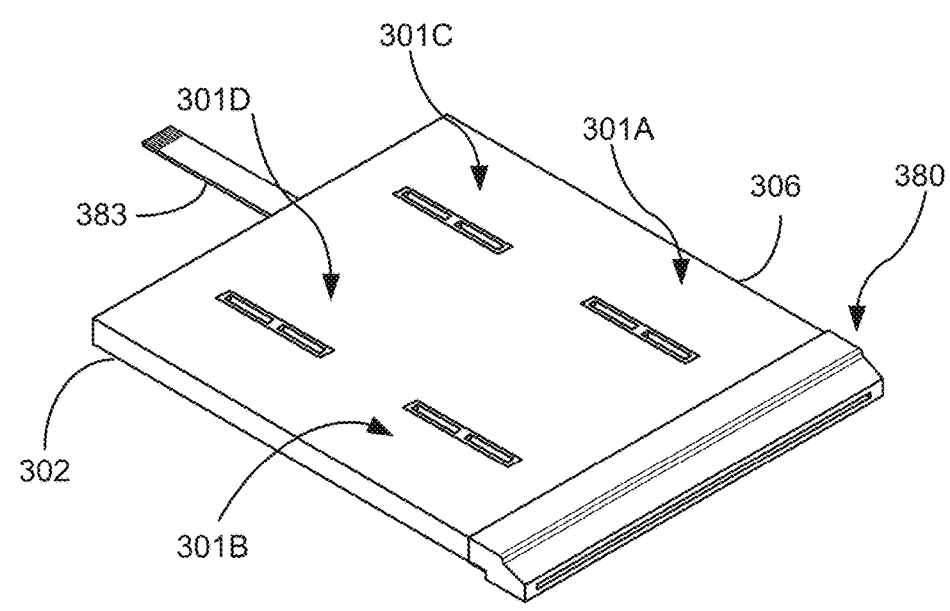
Figure 3C:
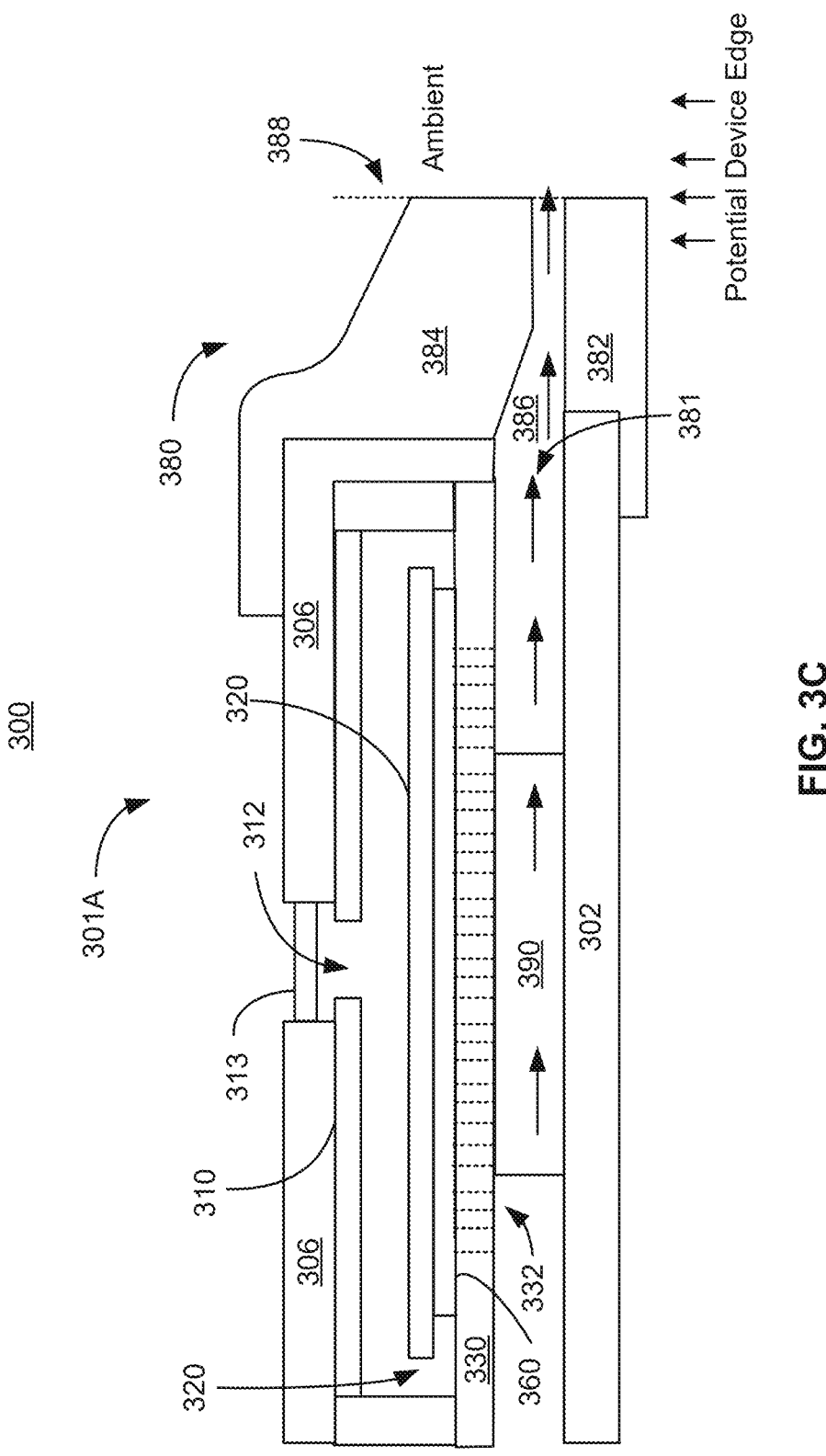
Figure 3D:
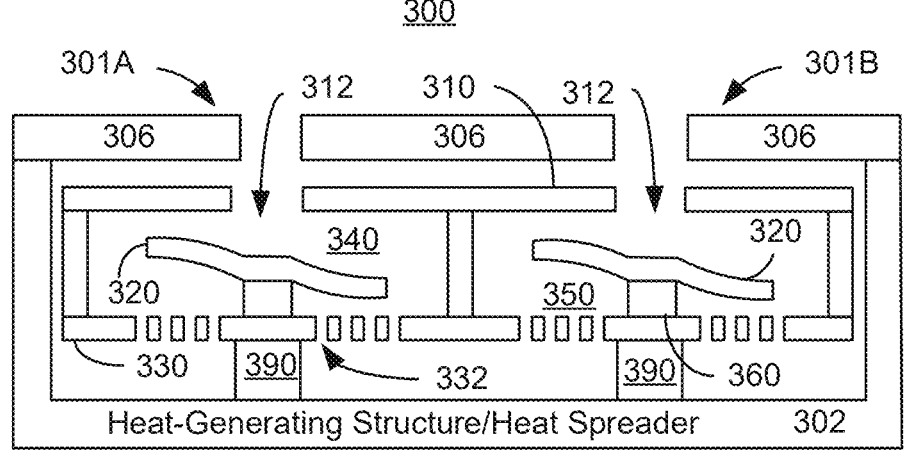
Figure 3E:
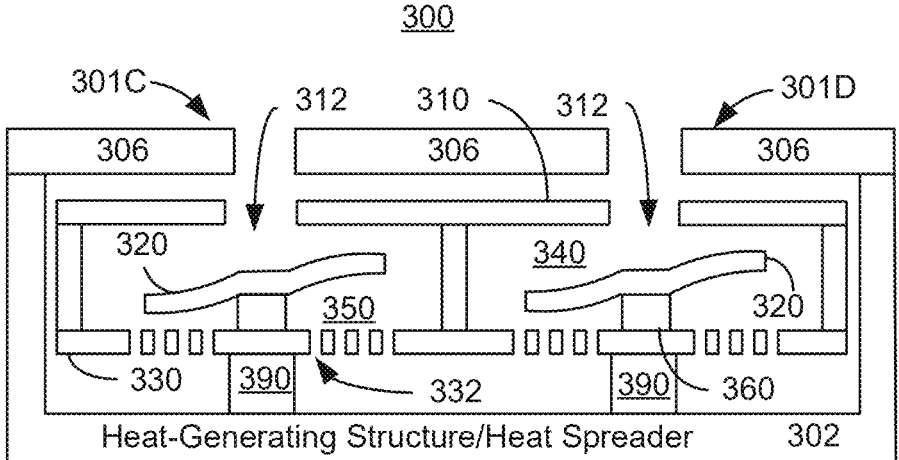

FIGS. 3A-3E depict an embodiment of active MEMS cooling system 300 including multiple cooling cells configured as a module termed a tile, or array. FIG. 3A depicts a perspective view with spout 380 removed. FIG. 3B depicts active MEMS cooling system 300 with cover 306 and spout 380. FIG. 3C depicts a side view of a portion of cooling system 300. FIGS. 3D-3E depict side/cross-sectional views of cooling system 300. FIGS. 3A-3E are not to scale. Cooling system 300 includes four cooling cells 301A, 301B, 301C and 301D (collectively or generically 301), which are analogous to one or more of cooling systems described herein. More specifically, cooling cells 301 are analogous to cooling system 100 and/or 200. Tile 300 thus includes four cooling cells 301 (i.e. four MEMS jets). Although four cooling cells 301 in a 2×2 configuration are shown, in some embodiments another number and/or another configuration of cooling cells 301 might be employed. In the embodiment shown, cooling cells 301 include shared top plate 310 having apertures 312, cooling elements 320, shared orifice plate 330 including orifices 332, top chambers 340, bottom chambers 350, anchors (support structures) 360, and pedestals 390 that are analogous to top plate 110 having apertures 112, cooling element 120, orifice plate 130 having orifices 132, top chamber 140, bottom chamber 150, anchor 160, and pedestal 190. In some embodiments, cooling cells 301 may be fabricated together and separated, for example by cutting through top plate 310, side walls between cooling cells 301, and orifice plate 330. Thus, although described in the context of a shared top plate 310 and shared orifice plate 330, after fabrication cooling cells 301 may be separated. In some embodiments, tabs (not shown) and/or other structures such as anchors 360 may connect cooling cells 301. Although not shown, cooling cells 301 may have cavities analogous to cavities 114, 134, and/or 135. Further, tile 300 includes heat-generating structure (termed a heat spreader hereinafter) 302 (e.g. a heat sink, a heat spreader, and/or other structure) that also has sidewalls, or fencing, in the embodiment shown. Cover 306 having apertures therein is also shown. In some embodiments, a dust filter (not shown) may be provided for the apertures. In such embodiments, dust may be less likely to reach the interior of cooling system 300. In some embodiments, a water tight, air porous membrane may be provided for the apertures. Heat spreader 302, cover 306, and spout 380 may be part of an integrated tile 300 as shown or may be separate from tile 300 in other embodiments. Heat spreader 302 and cover plate 306 may direct fluid flow outside of cooling cells 301, provide mechanical stability, and/or provide protection. Electrical connection to cooling cells 301 is provided via flex connector 380 (not shown in FIGS. 3C-3E) which may house drive electronics 385. Cooling elements 320 are driven out-of-phase (i.e. in a manner analogous to a see-saw). Further, as can be seen in FIGS. 3D-3E cooling element 320 in one cell is driven out-of-phase with cooling element(s) 320 in adjacent cell(s). Cooling elements 320 in a column are driven out-of-phase. Thus, cooling element 320 in cell 301A is out-of-phase with cooling element 320 in cell 301C. Similarly, cooling element 320 in cell 301B is out-of-phase with cooling element 320 in cell 301D. By driving cooling elements 320 out-of-phase, vibrations in cooling system 300 may be reduced. Cooling elements 320 may be driven in another manner in some embodiments. For example, cooling elements 301A and 301C may be driven in-phase but out-of-phase with cooling element 301B and 301D.

Cooling system 300 may also include spout 380 having dissipation region 386 therein. Thus, cooling system 300 including top cover 306 and heat spreader 302 may have a total thickness not exceeding four millimeters. In some embodiments, the height of cooling system 300 does not exceed 3.5 millimeters. In some embodiments, the height of cooling system 300 does not exceed 3 millimeters. In some embodiments, cooling system 300 has a height of at least 2 millimeters. Spout 380 includes a housing having bottom 382 and top 384, entrance 381 and exit 386. Entrance 381 is fluidically coupled with orifices 332 (i.e. egresses from flow chamber 340/350). The direction of fluid flow from flow chamber 340/350 may be seen by the unlabeled arrows in FIG. 3C. Spout 380 operates to smooth pulsations in the pressure waves generated by cooling elements 320. Because cooling elements 320 vibrate, the flow of fluid pulsates. Thus, the pressure of the fluid also pulsates between higher and lower pressures. Flow may also exit orifices 332 and travel through the jet channel in pulses. The pressure within flow chamber 340/350 and the jet channel is higher than the pressure of the ambient region. The fluid exits the jet channel and enters spout 380 at entrance 381. The fluid travels through dissipation region 386 and to exit 388. The pulsating pressure in the fluid is dissipated in dissipation region 384. Stated differently, the pulsations in pressure may be attenuated such that the pressure equilibrates and approaches (or reaches) the ambient pressure of the ambient region outside of system 300. In some embodiments, therefore, the pressure of the fluid at exit 388 of spout 380 matches or substantially the boundary conditions for the pressure of the ambient. In some embodiments of cooling system 300, spout 380 may be omitted. Also shown in FIG. 3C is optional dust guard 313. Dust guard 313 may be a MERV 14 or other analogous filter used to reduce or eliminate small particles from entering cooling system 300. Further, although cavities analogous to cavities 134 are not depicted in cooling system 300, such cavities may be present.

Cooling cells 301 of cooling system 300 function in an analogous manner to cooling system(s) 100, 200, and/or an analogous cooling system. Consequently, the benefits described herein may be shared by cooling system 300. Because cooling elements in nearby cells are driven out-of-phase, vibrations in cooling system 300 may be reduced. Because multiple cooling cells 301 are used, cooling system 300 may enjoy enhanced cooling capabilities. Further, multiples of individual cooling cells 301 and/or cooling system 300 may be combined in various fashions to obtain the desired footprint of cooling cells.

The fluid transfer systems and methods are described in the context of various features. The features of fluid transfer systems and method(s) described herein may be combined in various ways not explicitly depicted. Although systems 100, 200, and 300 are described as cooling systems, such systems transfer fluid. Thus, systems 100, 200, and 300 are fluid transfer systems analogous to other fluid transfer systems (e.g. fluid transfer systems 400, 600, 700, 800, 900, 900', 1000, 1100, and 1200) described herein. Similarly, fluid transfer systems described herein may also provide cooling. In addition, although fluid transfer systems are described in the context of single cells, multiple cells may be combined in a manner analogous to cooling system 300.

Figures 4, 5A, 5B, 5C:
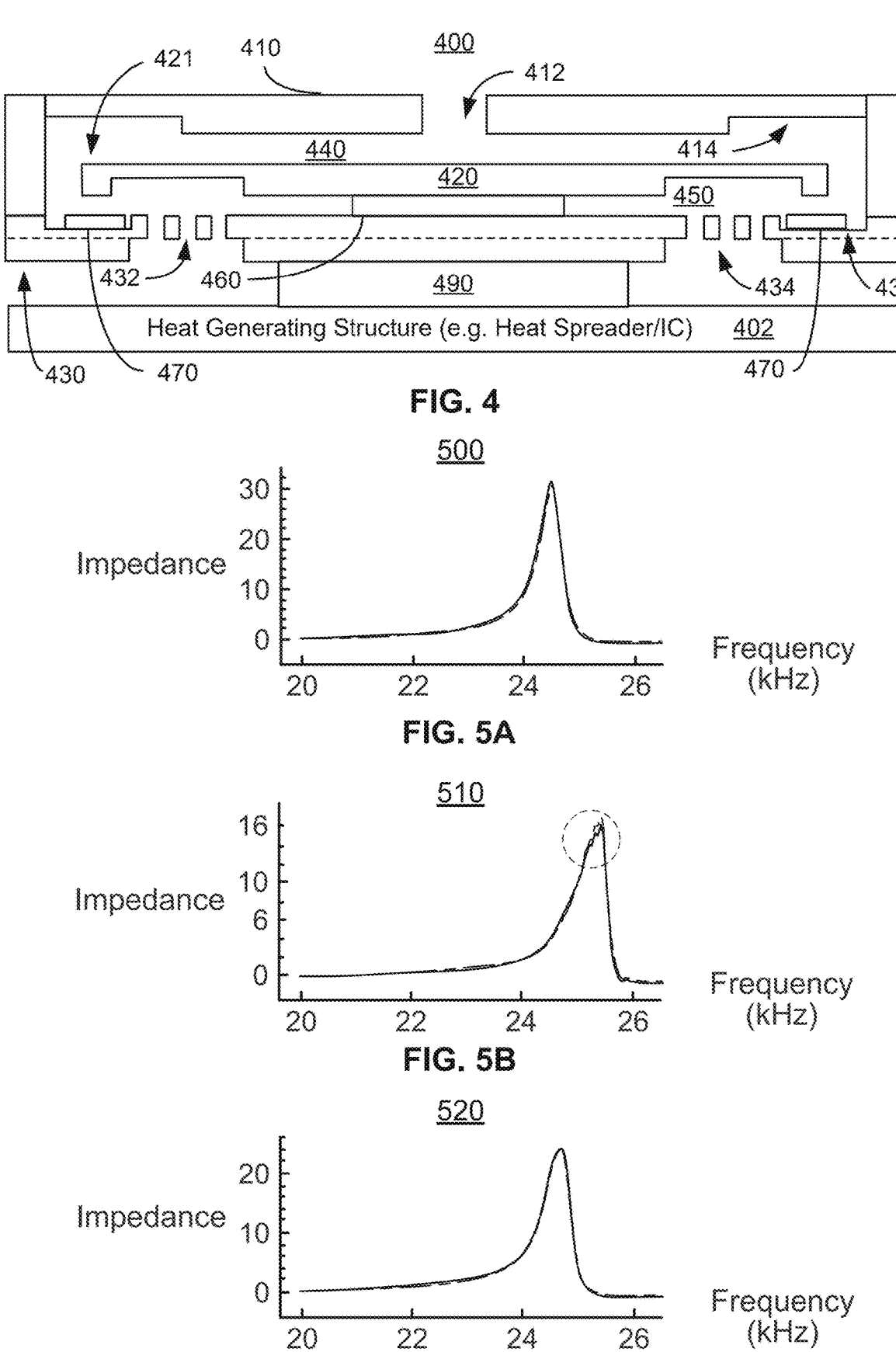
FIG. 4 depicts an embodiment of an active MEMS fluid transfer system having crash mitigation.
FIGS. 5A-5C are graphs depicting frequency behavior for active MEMS fluid transfer systems.

FIG. 4 depicts an embodiment of active MEMS fluid transfer system 400 having crash mitigation. Fluid transfer system 400 is analogous to cooling systems 100, 200, and 300. Thus, analogous components are labeled similarly. Fluid transfer system 400 includes heat-generating structure 402, top plate 410 having vent(s) 412 and cavities 414, active element 420, orifice plate 430 including orifices 432 and cavities 434 and 435, top chamber 440, bottom chambers 450 (together forming chamber 440/450), anchor (support structure) 460, and pedestal 490 that are analogous to heat-generating structure 102, top plate 110 having apertures 112 and cavities 114, cooling element 120, orifice plate 130 having orifices 132 and cavities 134 and 135, top chamber 140, bottom chamber 150, anchor 160, and pedestal 190. In some embodiments, a dust filter (not shown) may be provided for the aperture(s) 412. Thus, a jet channel may be formed between orifice plate 430 and plate 402. Although orifices 432 are shown in orifice plate 430, in some embodiments, orifices may be at the sidewalls of fluid transfer system 400. Although orifice plate 430 is depicted as a single plate, in some embodiments, orifice plate 430 may include an upper plate and a lower plate, which may be attached. For example, the dotted line shown in FIG. 4 may correspond to the interfaces of the upper and lower plates.

Fluid transfer system 400 also includes cushions 470 used in crash mitigation. In many embodiments, the components of fluid transfer system 400 (e.g. active element 420, orifice plate 430, top plate 410, and heat-generating structure 402) may be metal or another analogous material. Such structures are typically hard and/or stiff. In the absence of cushion 470, active element 420 may contact orifice plate 430 during operation. For example, active element 420 may be energized (power provided to the piezoelectric material of active element 420) and undergo vibrational motion. During use, dust may accumulate on orifice plate 430 and/or active element 420 near tip 421. Changes in temperature, variations in current, and/or other factors may result in the amplitude of vibration of active element 420 varying. Factors such as dust particles and/or variation in operating characteristics may cause active element 420 to contact orifice plate 430 (i.e. to crash). Such crashes may be audible even if active element 420 is driven at ultrasonic frequencies. For example, the crashes may generate subharmonics in the audible range (e.g. at 12 kHz, 8 kHz, or 6 kHz for an ultrasonic frequency of 24 kHz). Moreover, crashes may generate other vibrational modes in the structure of fluid transfer system 400. Consequently, crashes that have effects such as these are undesirable. Crashes may be avoided by reducing the amplitude of vibration of active element 420. However, in such a case, flow of the fluid through chamber 440/450 may be reduced. Moreover, the presence of dust particles may be challenging to compensate for.

Cushions 470 may mitigate the effects of crashes. Cushions 470 are softer than orifice plate 430 and active element 420. In some embodiments, cushions 470 are formed of foam or an analogous material. Cushions 470 may have a Shore A hardness of less than 100 or less than 95. In some embodiments, cushions 470 have a Shore A hardness of not more than 90 (which corresponds to a Youngs Modulus of less than approximately 30 MPa) or not more than 85. In some embodiments, cushions 470 have a Shore A hardness of at least 20, at least 40, at least 60, or at least 80. In some embodiments, cushions 470 may have a hardness ranging from a Shore 00 hardness of 50 through a Shore A hardness of not more than 30. Other hardnesses that mitigate the audible effects of crashes and, in some embodiments, introduction of other vibrational modes of the structure may be used.

Cushions 470 are between a portion of active element 420 and a portion of fluid transfer system 400 which active element 420 may contact when vibrating. Cushions 470 may be between the leading edge (i.e., the bottom surface for a downstroke) of active element 420 and the top surface of orifice plate 430. For example, a cushion may be placed in cavity 435 with a portion of the cushion aligned to the tip 421 of active element 420. Thus, instead of contacting a portion of orifice plate 430, active element 420 may contact cushion 470 if a crash occurs during vibration. Cushions 470 are configured such that cavities 435 remain. In some embodiments, cushions 470 may be sufficiently small that an additional space is between cushions 470 and the interior portion of orifice plate 430. However, in other embodiments, this space is omitted. In certain embodiments, cushion 470 might be place on the tip of the active element 420 (e.g. the surface opposite to orifice plate 430 near tip 421). Thus during motion of active element 420 in such embodiments, cushion 470 can come into contact with orifice plate 430. Some such embodiments are described in the context of FIGS. 10-12.

In some embodiments, bottom chamber 450 has a smaller height than top chamber 440. Consequently, active element 420 may be more likely to contact orifice plate 430 during vibrational motion of active element 420. Cushion 470 is thus between orifice plate 430 and a portion of active element 420. In some embodiments, cushions analogous to cushions 470 may be placed between active element 420 and top plate 410. Such cushions may be used if the height of top cavity 440 is reduced and/or if the amplitude of vibration of cooling element 420 is increased. For example, cushions (not shown) may be placed in cavity 414 with a portion of the cushion aligned to the tip 421 of active element 420. In some embodiments, cushions 470 and additional cushions (not shown) are placed between the leading edge (bottom surface for a downstroke) of active element 420 and orifice plate 430 and/or between the opposite edge (top surface/leading edge for an upstroke) of active element 430 and top plate 410. Thus, fluid transfer system 400 thus includes active element 420, a structural element coupled with active element 420, and cushion 470. The structural element may be viewed as some or all of the system (e.g., chamber 440/450, orifice plate 430, top plate 410, and/or sidewalls) which active element 420 may contact during operation.

Fluid transfer system 400 operates in an analogous manner to cooling systems 100, 200, and/or 300. Active element 420 is energized and undergoes vibrational motion. The vibrational motion may be at or near acoustic and/or structural resonance for active element 420. The vibrational motion draws fluid in through vent(s) 412, directs the flow through chamber 440/450 (e.g. around vibrating active element 420), and out of orifices 432. This fluid may be used to cool heat-generating structure 402.

Cushions 470 may improve performance of fluid transfer system 400. Cushions reduce the impact of crashes on performance of system 400. This may be seen, for example, using graphs 500, 510, and 520 of FIGS. 5A-5C. FIG. 5A depicts graph 500 of impedance versus frequency for a system analogous to system 400 without cushion 470 and in which active element 420 is driven such that crashes are avoided. Graph 500 indicates a smooth peak in impedance at resonance, which is around the driving frequency (approximately 24 kHz). FIG. 5B depicts graph 510 of impedance versus frequency for a system analogous to system 400 without cushion 470 and in which active element 420 is driven such that crashes occur. Graph 510 includes a main peak in impedance at resonance and around the driving frequency. However, there are sharp peaks on the main peak in impedance in a region indicated by the dashed oval. In addition, crashes result in audible noise at fractions of the drive frequency (i.e., at subharmonics of the driving frequency). For example, noise may occur at approximately one-half, one-third, and one-fourth of the driving frequency (e.g. at approximately 12 kHz, 8 kHz, and 6 kHz). The one-half subharmonic is typically the strongest. However, 12 kHz (and below) is within the audible range. Thus, the crashes may also be audible due to subharmonics. If sufficiently hard, crashes in a cooling system that lacks cushions may also excite other structural vibrational modes. These vibrations may mix with other vibrations. Thus, these additional modes may result in audible noise. Crash behavior results in higher overall sound levels (e.g., sound pressure level, or SPL) and higher prominent tone levels (total prominence ratio, or TPR). Consequently, performance of fluid transfer system 400 in the absence of cushion 470 may suffer and may exhibit audible noise that is undesirable. The active element in such a system may be placed further from the orifice plate and/or driven at lower amplitude (lower power) to eliminate crashes. However, the accumulation of dust may still result in crashes and the flow of fluid through such a system may be reduced.

In contrast, FIG. 5C depicts graph 520 of impedance versus frequency for a system analogous to system 400 including cushion 470 and driven such that crashes may occur. A main peak in impedance indicating resonance around the driving frequency (e.g. near 24 kHz) is present. In some cases, there may be a slight increase in resonant frequency. Although the main peak has a slightly different shape than the peak of graph 500, the sharp peaks present in graph 510 are not present in graph 520. Thus, the subharmonic modes due to the crash may be reduced or eliminated. In addition, because cushion 470 is softer than orifice plate 430, the excitation of other modes in the structure of fluid transfer system 400 by hard crashes may be reduced or eliminated. Consequently, the acoustic noise due to crashes may be dramatically reduced or eliminated (e.g. system 400 may have low SPL and low TPR). Because the effects of crashes have been mitigated, the behavior or fluid transfer system 400 may be less subject to the driving power and/or the presence of dust particles. For example, active element 420 may be driven at higher power, which corresponds to a larger amplitude of vibration. Active element 420 may vibrate such that there is a very small (or no) gap between active element 420 and cushion 470 during operation. Fluid flow may be enhanced. Thus, not only may audible noise due to operation of fluid transfer system 400 be addressed, but performance may be improved.

Figure 6:
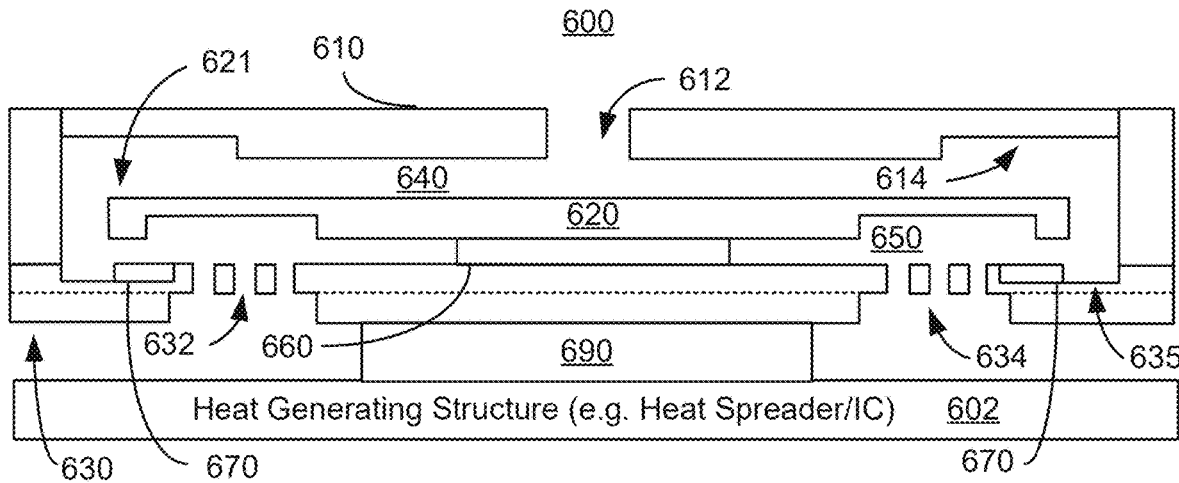
FIG. 6 depicts an embodiment of an active MEMS fluid transfer system having crash mitigation.

FIG. 6 depicts an embodiment of active MEMS fluid transfer system 600 having crash mitigation. Fluid transfer system 600 is analogous to cooling systems 100, 200, 300, and 400. Thus, analogous components are labeled similarly. Fluid transfer system 600 includes heat-generating structure 602, top plate 610 having vent(s) 612 and cavities 614, active element 620, orifice plate 630 including orifices 632 and cavities 634 and 635, top chamber 640, bottom chambers 650 (together forming chamber 640/650), anchor (support structure) 660, and pedestal 690 that are analogous to heat-generating structure 102 and/or 402, top plate 110 and/or 410 having apertures 112 and/or 412 and cavities 114 and/or 414, cooling element 120 and/or 420, orifice plate 130 and/or 430 having orifices 132 and/or 432 and cavities 134 and/or 434 and 135 and/or 435, top chamber 140 and/or 440, bottom chamber 150 and/or 450, anchor 160 and/or 460, and pedestal 190 and/or 490. In some embodiments, a dust filter (not shown) may be provided for the aperture(s) 612. Thus, a jet channel may be formed between orifice plate 630 and plate 602. Although orifices 632 are shown in orifice plate 630, in some embodiments, orifices may be at the sidewalls of fluid transfer system 600. Although orifice plate 630 is depicted as a single plate, in some embodiments, orifice plate 630 may include an upper plate and a lower plate, which may be attached. For example, the dotted line shown in FIG. 6 may correspond to the interfaces of the upper and lower plates.

Fluid transfer system 600 also includes cushions 670 that are analogous to cushions 470. Consequently, cushions 670 may mitigate the effects of crashes of active element 620 (i.e. contact between cushions 670 and active element 620) during operation. In fluid transfer system 600, cavities 635 are still present. Cushions 670 are configured such that a portion of active element 620 near tip 621 extends over cavity 635. This may improve fluid flow through fluid transfer system 600. For example, in some embodiments, fluid flow may be increased by nominally ten percent (e.g. at least seven percent and not more than thirteen percent).

Fluid transfer system 600 operates in an analogous manner to and may share the benefits of fluid transfer system 400, as well as cooling systems 100, 200, and/or 300. Fluid transfer system 600 may efficiently cool heat-generating structure 602 and other structures that are thermally coupled, for example via conduction, to heat-generating structure 602. For example, components such as integrated circuits, batteries, heat spreaders, and vapor chambers may be more efficiently cooled. Because of the presence of cushions 670 the effects of crashes may be mitigated. In addition, active element 620 may be driven at higher amplitudes, allowing for greater flow through fluid transfer system 600. Thus, the performance of fluid transfer system 600 may be improved.

Figure 7:
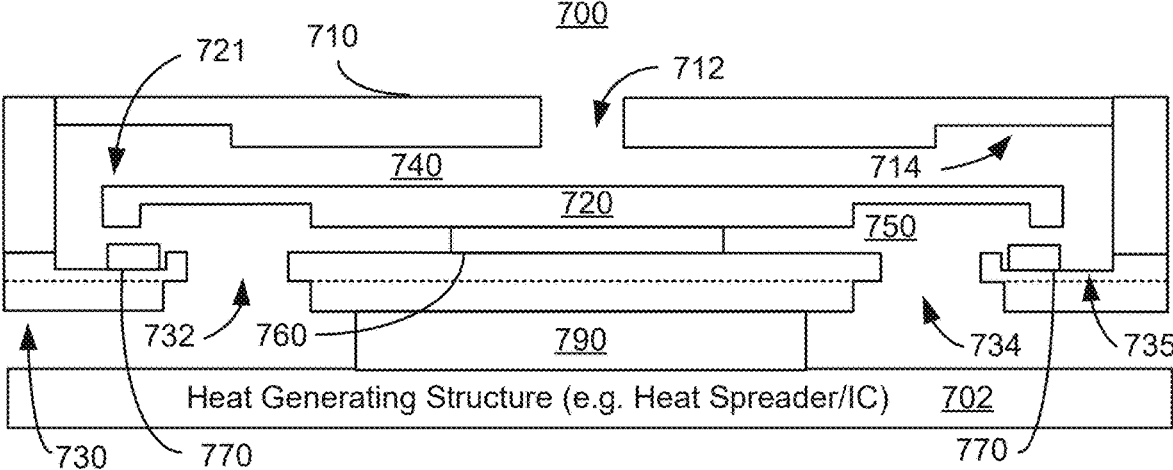
FIG. 7 depicts an embodiment of an active MEMS fluid transfer system having crash mitigation.

FIG. 7 depicts an embodiment of active MEMS fluid transfer system 700 having crash mitigation. Fluid transfer system 700 is analogous to fluid transfer systems 100, 200, 300, 400, and/or 600. Thus, analogous components are labeled similarly. Fluid transfer system 700 includes heat-generating structure 702, top plate 710 having vent(s) 712 and cavities 714, active element 720, orifice plate 730 including orifices 732 and cavities 734 and 735, top chamber 740, bottom chambers 750 (together forming chamber 740/ 750), anchor 760, and pedestal 790 that are analogous to heat-generating structure 102 and/or 402, top plate 110 and/or 410 having apertures 112 and/or 412 and cavities 114 and/or 414, cooling element 120 and/or 420, orifice plate 130 and/or 430 having orifices 132 and/or 432 and cavities 134 and/or 434 and 135 and/or 435, top chamber 140 and/or 440, bottom chamber 150 and/or 450, anchor 160 and/or 460, and pedestal 190 and/or 490. In some embodiments, a dust filter (not shown) may be provided for the aperture(s) 712. Thus, a jet channel may be formed between orifice plate 730 and plate 702. Although orifices 732 are shown in orifice plate 730, in some embodiments, orifices may be at the sidewalls of fluid transfer system 700. Although orifice plate 730 is depicted as a single plate, in some embodiments, orifice plate 730 may include an upper plate and a lower plate, which may be attached. For example, the dotted line shown in FIG. 7 may correspond to the interfaces of the upper and lower plates.

Fluid transfer system 700 also includes cushions 770 that are analogous to cushions 470 and 670. Consequently, cushions 770 may mitigate the effects of crashes of active element 720 (i.e. contact between cushions 770 and active element 720) during operation. In fluid transfer system 700, cavities 735 are still present. Cushions 770 are configured such that a portion of active element 720 near tip 721 extends over cavity 735. This may improve fluid flow through fluid transfer system 700. In other embodiments, cushions 770 may be configured such that no portion of active element 720 extends over cavities 735. In addition, the heights of cushions 770 are sufficiently large that cushions 770 protrude above orifice plate 730. Thus, cushions 770 can, but need not, be flush with the highest portion of orifice plate 730. In some embodiments, cushions 770 may be somewhat recessed from the highest portion of orifice plate 730.

In addition, the number of orifices 732 in orifice plate 730 has been reduced and the footprint of orifices 732 increased. The speed at which the fluid (e.g. air) exits through orifices 732 depends upon the size. The speed is generally increased with decreasing size of orifices 732. However, for some larger orifices, the flow may be increased even though the speed decreases. Thus, fluid transfer system 700 may have enhanced flow. In other embodiments, orifices 732 may be configured in a manner analogous to orifices 432 and/or 632 (e.g. smaller in size and possibly larger in number).

Fluid transfer system 700 operates in an analogous manner to and may share the benefits of fluid transfer systems 400 and/or 600, as well as cooling systems 100, 200, and/or 300. Fluid transfer system 700 may efficiently cool heat-generating structure 702 and other structures that are thermally coupled, for example via conduction, to heat-generating structure 702. For example, components such as integrated circuits, batteries, heat spreaders, and vapor chambers may be more efficiently cooled. Because of the presence of cushions 770 the effects of crashes may be mitigated. In addition, active element 720 may be driven at higher amplitudes, allowing for greater flow through fluid transfer system 700. Thus, the performance of fluid transfer system 700 may be improved.

Figure 8:
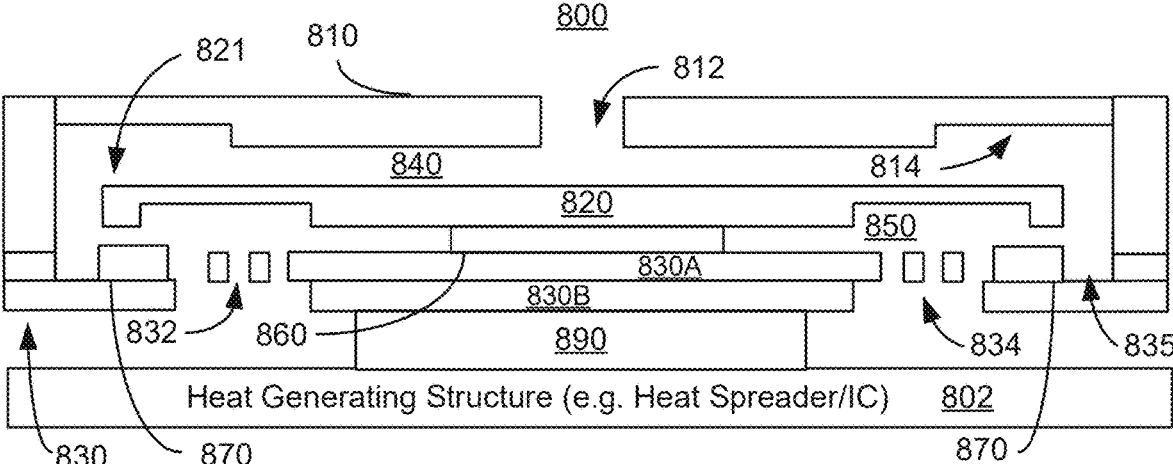
FIG. 8 depicts an embodiment of an active MEMS fluid transfer system having crash mitigation.

FIG. 8 depicts an embodiment of active MEMS fluid transfer system 800 having crash mitigation. Fluid transfer system 800 is analogous to fluid transfer systems 100, 200, 300, 400, 600, and/or 700. Thus, analogous components are labeled similarly. Fluid transfer system 800 includes heat-generating structure 802, top plate 810 having vent(s) 812 and cavities 814, active element 820, orifice plate 830 including orifices 832 and cavities 834 and 835, top chamber 840, bottom chambers 850 (together forming chamber 840/ 850), anchor 860, and pedestal 890 that are analogous to heat-generating structure 102 and/or 402, top plate 110 and/or 410 having apertures 112 and/or 412 and cavities 114 and/or 414, cooling element 120 and/or 420, orifice plate 130 and/or 430 having orifices 132 and/or 432 and cavities 134 and/or 434 and 135 and/or 435, top chamber 140 and/or 440, bottom chamber 150 and/or 450, anchor 160 and/or 460, and pedestal 190 and/or 490. In some embodiments, a dust filter (not shown) may be provided for the aperture(s) 812. Thus, a jet channel may be formed between orifice plate 830 and plate 802. Although orifices 832 are shown in orifice plate 830, in some embodiments, orifices may be at the sidewalls of fluid transfer system 800.

Orifice plate 830 includes upper plate 830A and lower plate 830B. Upper plate 830A and lower plate 830B are attached, for example by bonding. Cavities 834 are formed by apertures in lower plate 830B. Cavities 835 are formed by apertures in upper plate 830A. Orifices 832 in upper plate 830A are aligned with cavities/apertures 834 in lower plate 830B.

Fluid transfer system 800 also includes cushions 870 that are analogous to cushions 470, 670, and 770. Consequently, cushions 870 may mitigate the effects of crashes of active element 820 (i.e. contact between cushions 870 and active element 820) during operation. Cushions 870 are substantially aligned with tip 821. As a result, no portion of active element 820 extends over cavities 835. However, cushions 870 may be located differently. For example, cushions 870 may be placed such that a portion of active element 820 near tip 821 extends over cavity 835. This may improve fluid flow through fluid transfer system 800. In addition, the heights of cushions 870 are sufficiently large that cushions 870 protrude above orifice plate 830. Thus, cushions 870 can, but need not, be flush with the highest portion of orifice plate 830. In some embodiments, cushions 870 may be somewhat recessed from the highest portion of orifice plate 830.

In addition, cushions 870 are within apertures in upper plate 830A (from which cavities 835 are also formed). Thus, cushions 870 are attached to lower plate 830B. Upper plate 830A may be diffusion bonded to active element 820 or anchor 860 (which may be part of active element 820). Cushions 870 may be constructed of material(s) that are damaged by the diffusion bonding process. Affixing cushions 870 to lower plate 830B may allow for the diffusion bonding process between active element 820/anchor 860 and upper plate 830A, while preserving the structure and functions of cushions 870. Thus, performance of fluid transfer system 800 may be improved.

Fluid transfer system 800 operates in an analogous manner to and may share the benefits of fluid transfer systems 400, 600, and/or 700, as well as cooling systems 100, 200, and/or 300. Fluid transfer system 800 may efficiently cool heat-generating structure 802 and other structures that are thermally coupled, for example via conduction, to heat-generating structure 802. For example, components such as integrated circuits, batteries, heat spreaders, and vapor chambers may be more efficiently cooled. Because of the presence of cushions 870 the effects of crashes may be mitigated. In addition, active element 820 may be driven at higher amplitudes, allowing for greater flow through fluid transfer system 800. Further, diffusion bonding of active element 820/anchor 860 to orifice plate 830 may be facilitated. Thus, the performance of fluid transfer system 800 may be improved.

Figure 9A:
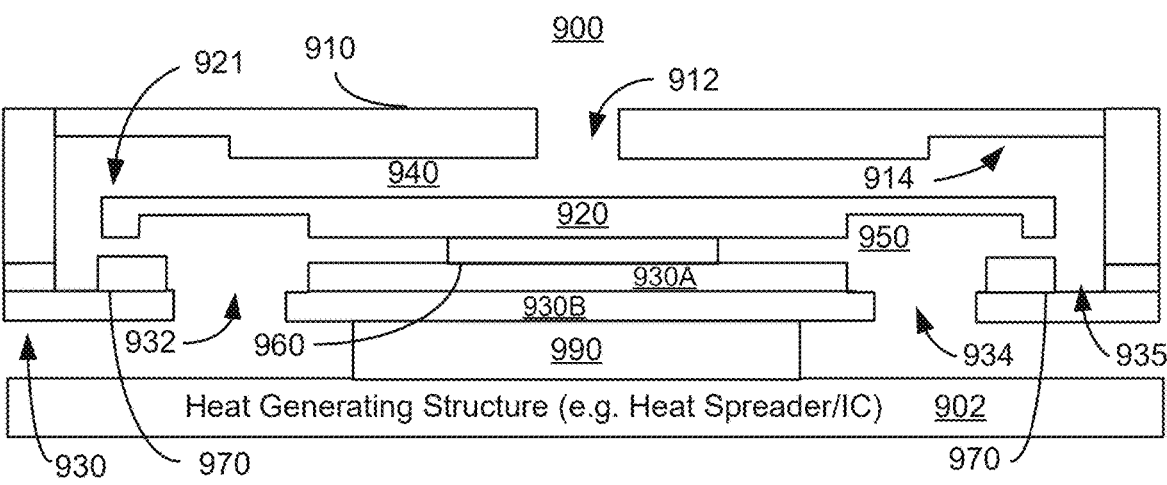
FIGS. 9A-9B depict embodiments of active MEMS fluid transfer systems having crash mitigation.
Figure 9B:
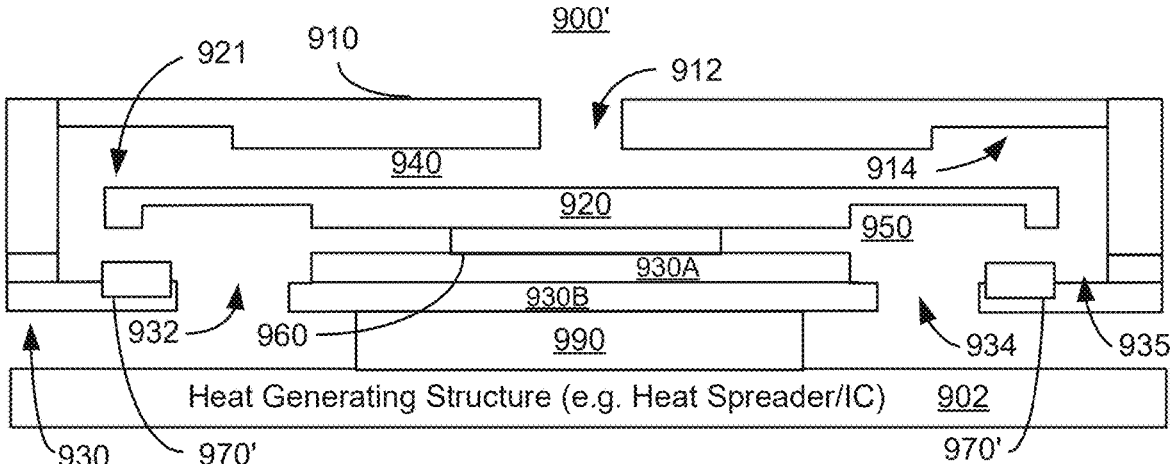

FIGS. 9A and 9B depicts embodiment of active MEMS fluid transfer systems 900 and 900' having crash mitigation. Fluid transfer systems 900 and 900' are analogous to fluid transfer systems 100, 200, 300, 400, 600, 700, and/or 800. Thus, analogous components are labeled similarly. Fluid transfer systems 900 and 900' each includes heat-generating structure 902, top plate 910 having vent(s) 912 and cavities 914, active element 920, orifice plate 930 including orifices 932 and cavities 934 and 935, top chamber 940, bottom chambers 950 (together forming chamber 940/950), anchor 960, and pedestal 990 that are analogous to heat-generating structure 102 and/or 402, top plate 110 and/or 410 having apertures 112 and/or 412 and cavities 114 and/or 414, cooling element 120 and/or 420, orifice plate 130 and/or 430 having orifices 132 and/or 432 and cavities 134 and/or 434 and 135 and/or 435, top chamber 140 and/or 440, bottom chamber 150 and/or 450, anchor 160 and/or 460, and pedestal 190 and/or 490. In some embodiments, a dust filter (not shown) may be provided for the aperture(s) 912. Thus, a jet channel may be formed between orifice plate 930 and plate 902. Although orifices 932 are shown in orifice plate 930, in some embodiments, orifices may be at the sidewalls of fluid transfer system 900.

Orifice plate 930 includes upper plate 930A and lower plate 930B. Upper plate 930A and lower plate 930B are attached, for example by bonding. Cavities 934 are formed by apertures in lower plate 930B. Cavities 935 are formed by apertures in upper plate 930A. Orifices 932 in upper plate 930A are aligned with cavities/apertures 934 in lower plate 930B. In the embodiments shown, orifices 932 in upper plate 930A are larger than cavities 934 in lower plate 930B. However, orifices 932 and cavities 934 may be configured in another manner.

Fluid transfer systems 900 and 900' each includes cushions 970 and 970', respectively. Cushions 970 and 970' are analogous to cushions 470, 670, 770, and 870. Consequently, cushions 970 and 970' may mitigate the effects of crashes of active element 920 (i.e. contact between cushions 970/970' and active element 920) during operation. Cushions 970 and 970' are substantially aligned with tip 921. However, cushions 970 and 970' may be located differently. Cushions 970 and 970' are within apertures in upper plate 930A. Thus, cushions 970 and 970' are attached to lower plate 930B in a manner analogous to cushions 870 and lower plate 830B. Thus, diffusion bonding of active element 920/anchor 960 to upper plate 930A is facilitated. In addition, cushion 970' is set into a trench in lower plate 930B.

Fluid transfer systems 900 and 900' operate in an analogous manner to and may share the benefits of fluid transfer systems 400, 600, 700, and/or 800, as well as cooling systems 100, 200, and/or 300. Fluid transfer systems 900 and 900' may efficiently cool heat-generating structure 902 and other structures that are thermally coupled, for example via conduction, to heat-generating structure 902. For example, components such as integrated circuits, batteries, heat spreaders, and vapor chambers may be more efficiently cooled. Because of the presence of cushions 970 and 970', the effects of crashes may be mitigated. In addition, active elements 920 may be driven at higher amplitudes, allowing for greater flow through fluid transfer system 900 and 900'. Further, diffusion bonding of active element 920/anchor 960 to orifice plate 930 may be facilitated. The use of a smaller number of larger orifices 932 may also improve fluid flow in fluid transfer system 900 and/or 900'. Thus, the performance of fluid transfer systems 900 and 900' may be improved.

Figure 10:
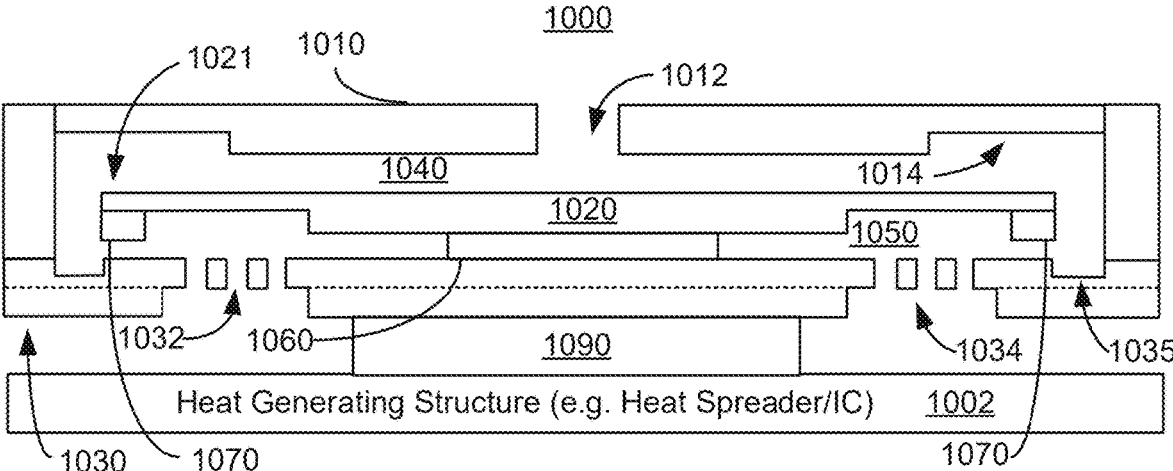
FIG. 10 depicts an embodiment of an active MEMS fluid transfer system having crash mitigation.

FIG. 10 depicts an embodiment of active MEMS fluid transfer system 1000 having crash mitigation. Fluid transfer system 1000 is analogous to fluid transfer systems 100, 200, 300, 400, 600, 800, and/or 900/900'. Thus, analogous components are labeled similarly. Fluid transfer system 1000 includes heat-generating structure 1002, top plate 1010 having vent(s) 1012 and cavities 1014, active element 1020, orifice plate 1030 including orifices 1032 and cavities 1034 and 1035, top chamber 1040, bottom chambers 1050 (together forming chamber 1040/1050), anchor 1060, and pedestal 1090 that are analogous to heat-generating structure 102 and/or 402, top plate 110 and/or 410 having apertures 112 and/or 412 and cavities 114 and/or 414, cooling element 120 and/or 420, orifice plate 130 and/or 430 having orifices 132 and/or 432 and cavities 134 and/or 434 and 135 and/or 435, top chamber 140 and/or 440, bottom chamber 150 and/or 450, anchor 160 and/or 460, and pedestal 190 and/or 490. In some embodiments, a dust filter (not shown) may be provided for the aperture(s) 1012. Thus, a jet channel may be formed between orifice plate 1030 and plate 1004. Although orifices 1032 are shown in orifice plate 1030, in some embodiments, orifices may be at the sidewalls of fluid transfer system 1000. Although orifice plate 1030 is depicted as a single plate, in some embodiments, orifice plate 1030 may include an upper plate and a lower plate, which may be attached. For example, the dotted line shown in FIG. 10 may correspond to the interfaces of the upper and lower plates.

Fluid transfer system 1000 also includes cushions 1070 that are analogous to cushions 470, 670, 770, 870, and 970/970'. Cushions 1070 are between orifice plate 1030 and a portion of active element 1020 that may be hard (e.g. formed of metal such as Ti or a Ti alloy). Consequently, cushions 1070 may mitigate the effects of crashes of active element 1020 (i.e. contact between cushions 1070 of active element 1020 and orifice plate 1030) during operation. However, cushions 1070 are affixed to or part of active element 1020 instead of orifice plate 1030. In the embodiment shown, the thicker, outer region of active element 1020 that is analogous to region 128 of cooling element 120' includes cushions 1070.

Fluid transfer system 1000 operates in an analogous manner to and may share the benefits of fluid transfer systems 400, 600, 700, 800, and/or 900/900', as well as cooling systems 100, 200, and/or 300. Fluid transfer system 1000 may efficiently cool heat-generating structure 1002 and other structures that are thermally coupled, for example via conduction, to heat-generating structure 1002. For example, components such as integrated circuits, batteries, heat spreaders, and vapor chambers may be more efficiently cooled. Because of the presence of cushions 1070 the effects of crashes may be mitigated. In addition, active element 1020 may be driven at higher amplitudes, allowing for greater flow through fluid transfer system 1000. Thus, the performance of fluid transfer system 1000 may be improved.

Figure 11:
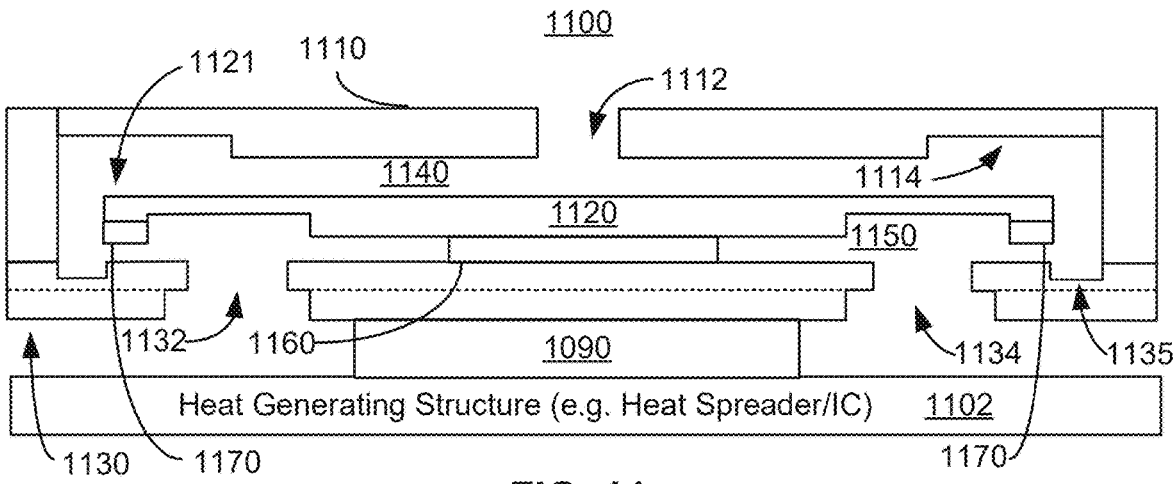
FIG. 11 depicts an embodiment of an active MEMS fluid transfer system having crash mitigation.

FIG. 11 depicts an embodiment of active MEMS fluid transfer system 1100 having crash mitigation. Fluid transfer system 1100 is analogous to fluid transfer systems 110, 200, 300, 400, 600, 800, 900/900' and/or 1000. Thus, analogous components are labeled similarly. Fluid transfer system 1100 includes heat-generating structure 1102, top plate 1110 having vent(s) 1112 and cavities 1114, active element 1120, orifice plate 1130 including orifices 1132 and cavities 1134 and 1135, top chamber 1140, bottom chambers 1150 (together forming chamber 1140/1150), anchor 1160, and pedestal 1190 that are analogous to heat-generating structure 112 and/or 402, top plate 110 and/or 410 having apertures 112 and/or 412 and cavities 114 and/or 414, cooling element 120 and/or 420, orifice plate 130 and/or 430 having orifices 132 and/or 432 and cavities 134 and/or 434 and 135 and/or 435, top chamber 140 and/or 440, bottom chamber 150 and/or 450, anchor 160 and/or 460, and pedestal 190 and/or 490. In some embodiments, a dust filter (not shown) may be provided for the aperture(s) 1112. Thus, a jet channel may be formed between orifice plate 1130 and plate 1102. Although orifices 1132 are shown in orifice plate 1130, in some embodiments, orifices may be at the sidewalls of fluid transfer system 1100. Although orifice plate 1130 is depicted as a single plate, in some embodiments, orifice plate 1130 may include an upper plate and a lower plate, which may be attached. For example, the dotted line shown in FIG. 11 may correspond to the interfaces of the upper and lower plates.

Fluid transfer system 1100 also includes cushions 1170 that are analogous to cushions 470, 670, 770, 870, 970/970' and/or 1070. Cushions 1170 are between orifice plate 1130 and a portion of active element 1120 that may be hard (e.g.

formed of metal such as Ti or a Ti alloy). Consequently, cushions 1170 may mitigate the effects of crashes of active element 1120 (i.e. contact between cushions 1170 of active element 1120 and orifice plate 1130) during operation. However, cushions 1170 are affixed to or part of active element 1120 instead of orifice plate 1130. In the embodiment shown, the thicker, outer region of active element 1120 that is analogous to region 128 of cooling element 120' includes cushions 1170. A portion of the thicker region is formed by each cushion 1170, and a portion formed by a thicker remaining portion of active element 1120. In addition, apertures 1132 are fewer in number but have a larger footprint. In other embodiments, fewer apertures, each of which may have a smaller footprint (e.g. analogous to apertures 432) may be used.

Fluid transfer system 1100 operates in an analogous manner to and may share the benefits of fluid transfer systems 400, 600, 700, 800, 900/900' and/or 1000, as well as cooling systems 110, 200, and/or 300. Fluid transfer system 1100 may efficiently cool heat-generating structure 1102 and other structures that are thermally coupled, for example via conduction, to heat-generating structure 1102. For example, components such as integrated circuits, batteries, heat spreaders, and vapor chambers may be more efficiently cooled. Because of the presence of cushions 1170 the effects of crashes may be mitigated. In addition, active element 1120 may be driven at higher amplitudes, allowing for greater flow through fluid transfer system 1100. Further, the configuration of apertures 1132 may enhance fluid flow. Thus, the performance of fluid transfer system 1100 may be improved.

Figure 12:
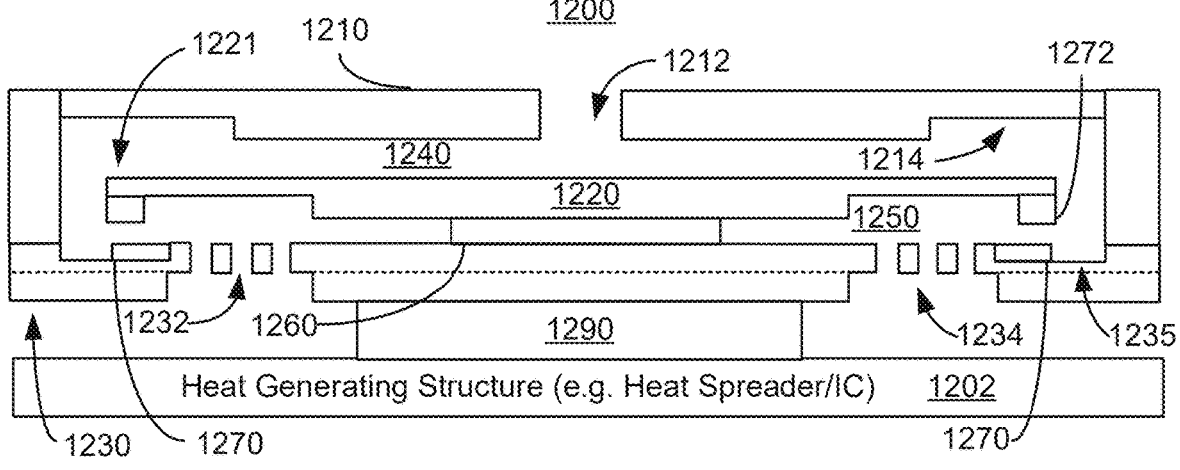
FIG. 12 depicts an embodiment of an active MEMS fluid transfer system having crash mitigation.

FIG. 12 depicts an embodiment of active MEMS fluid transfer system 1200 having crash mitigation. Fluid transfer system 1200 is analogous to fluid transfer systems 120, 200, 300, 400, 600, 800, 900/900', 1000 and/or 1100. Thus, analogous components are labeled similarly. Fluid transfer system 1200 includes heat-generating structure 1202, top plate 1210 having vent(s) 1212 and cavities 1214, active element 1220, orifice plate 1230 including orifices 1232 and cavities 1234 and 1235, top chamber 1240, bottom chambers 1250 (together forming chamber 1240/1250), anchor 1260, and pedestal 1290 that are analogous to heat-generating structure 122 and/or 402, top plate 120 and/or 410 having apertures 122 and/or 412 and cavities 124 and/or 414, cooling element 120 and/or 420, orifice plate 130 and/or 430 having orifices 132 and/or 432 and cavities 134 and/or 434 and 135 and/or 435, top chamber 140 and/or 440, bottom chamber 150 and/or 450, anchor 160 and/or 460, and pedestal 190 and/or 490. In some embodiments, a dust filter (not shown) may be provided for the aperture(s) 1212. Thus, a jet channel may be formed between orifice plate 1230 and plate 1202. Although orifices 1232 are shown in orifice plate 1230, in some embodiments, orifices may be at the sidewalls of fluid transfer system 1200. Although orifice plate 1230 is depicted as a single plate, in some embodiments, orifice plate 1230 may include an upper plate and a lower plate, which may be attached. For example, the dotted line shown in FIG. 12 may correspond to the interfaces of the upper and lower plates.

Fluid transfer system 1200 also includes cushions 1270 and 1272 that are analogous to cushions 470, 670, 770, 870, 970/970', 1070, and/or 1170. Cushions 1270 and 1272 are between orifice plate 1230 and a portion of active element 1220 that may be hard (e.g. formed of metal such as Ti or a Ti alloy). Consequently, cushions 1270 and 1272 may mitigate the effects of crashes of active element 1220 (i.e. contact between cushions 1272 of active element 1220 and cushions 1270 for orifice plate 1230) during operation. Cushions 1272 are affixed to or part of active element 1220, while cushions 1270 are affixed to orifice plate 1230. Thus, cushions 1272 are most analogous to cushions 1070 and 1170. Cushions 1270 are analogous to cushions 470, 670, 770, 870, 970, and/or 970'. In some embodiments, orifice plate 1230 may include upper and lower plates. In such embodiments, cushions 1270 may be affixed to the lower plate.

Fluid transfer system 1200 operates in an analogous manner to and may share the benefits of fluid transfer systems 400, 600, 700, 800, 900/900', 1000 and/or 1100, as well as cooling systems 120, 200, and/or 300. Fluid transfer system 1200 may efficiently cool heat-generating structure 1202 and other structures that are thermally coupled, for example via conduction, to heat-generating structure 1202. For example, components such as integrated circuits, batteries, heat spreaders, and vapor chambers may be more efficiently cooled. Because of the presence of cushions 1270/1272 the effects of crashes may be mitigated. In addition, active element 1220 may be driven at higher amplitudes, allowing for greater flow through fluid transfer system 1200. Thus, the performance of fluid transfer system 1200 may be improved.

In fluid transfer systems 400, 600, 700, 800, 900, 900', 1000, 1100, and 1200, cushions 470, 670, 770, 870, 970, 970', 1070, 1170, and 1270/1272 are between active elements 420, 620, 720, 820, 920, 1020, 1120, and 1220 and orifice plates 430, 630, 730, 830, 930, 1030, 1130, and 1230. In some embodiments, additional or other cushions (not shown) analogous to cushions 470, 670, 770, 870, 970, 970', 1070, 1170, and/or 1270/1272 may be between the active element and the top plate. Such cushions may mitigate crashes of the active element (e.g. the leading edge of the active element for an upstroke) with the top plate. Thus, cushions may be used in region(s) that may be likely to crash.

Figure 13:
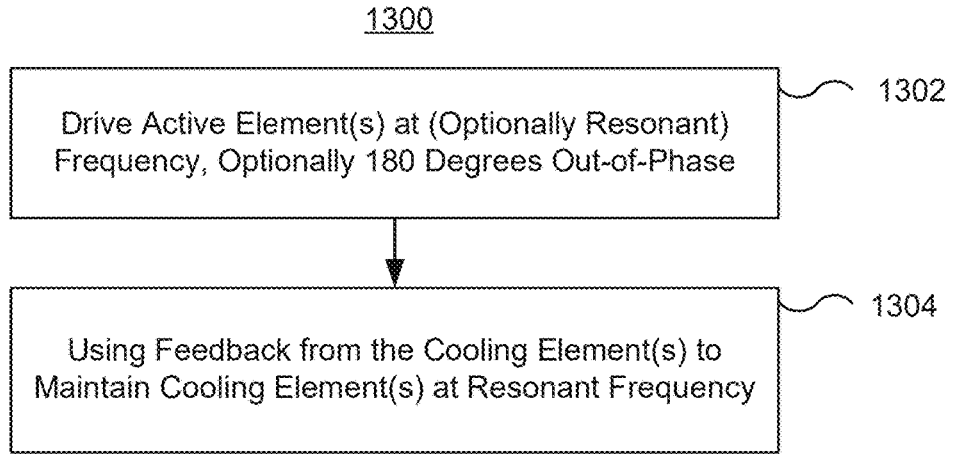
FIG. 13 is a flow chart depicting an embodiment of a method for using an active MEMS fluid transfer system including crash mitigation.

FIG. 13 is a flow chart depicting an embodiment of method 1300 for using an active MEMS fluid transfer system employing crash mitigation. Method 1300 may include steps that are not depicted for simplicity. Method 1300 is described in the context of fluid transfer systems 400, 600, 700, 800, 900, 900', 1000, 1100, and/or 1200. However, method 1300 may be used with other fluid systems including but not limited to systems and cells (e.g. cooling systems 100, 200, and/or 300) described herein.

One or more of the active elements in a fluid transfer system is actuated to vibrate at 1302. At 1302, an electrical signal having the desired frequency is used to drive the active element(s). In some embodiments, the active elements are driven at or near structural and/or acoustic resonant frequencies at 1302. The driving frequency may be 15 kHz or higher. In some embodiments, the driving signal may be 20 kHz or higher. For example, the frequency may be 22 kHz-26 kHz (e.g. nominally 24 kHz). If multiple active elements are driven at 1302, the active elements may be driven out-of-phase. In some embodiments, the active elements are driven substantially at one hundred and eighty degrees out of phase. Further, in some embodiments, individual active elements are driven out-of-phase. For example, different portions of an active element may be driven to vibrate in opposite directions (i.e. analogous to a seesaw as shown in FIGS. 1E and 1F). In some embodiments, individual active elements may be driven in-phase (i.e. analogous to a butterfly). In addition, the drive signal may be provided to the anchor(s), the cooling element(s), or both the anchor(s) and the active element(s). Further, the anchor may be driven to bend and/or translate.

At 1302, the amplitude of vibration of the active element may be selected such that a gap between the active element and the cushion (or the gap between the cushion and the orifice plate) need not always be maintained. Thus, the amplitude of vibration is set such that crashes may occur. In some embodiments, the driving of the active element at 1302 is configured such that gap is very small (e.g. within 10 micrometers of a crash, within 5 micrometers of a crash, or less) or such that contact (e.g. a light crash) is possible during normal operation. For example, the power provided to the piezoelectric material(s) used to vibrate the active element may be set such that the amplitude of vibration of the active element during normal operation includes some contact between the cushion and the active element (e.g. the active element may touch the cushion) or some contact between the cushion on the active element and the orifice plate. In other embodiments, the power may be set such that a gap between the active element and the cushion (or between the cushion and the orifice plate) is present for normal operation. Thus, contact/crashes may occur, but contact may not be considered part of normal operation. Also at 1302, the active element is energized based on this amplitude.

Feedback from the active element(s) may be used to adjust the driving current, at 1304. In some embodiments, the adjustment is used to maintain the frequency at or near the acoustic and/or structural resonant frequency/frequencies of the active element(s) and/or fluid transfer system. Resonant frequency of a particular active element may drift, for example due to changes in temperature or changes in the active element itself. Adjustments made at 1304 allow the drift in resonant frequency to be accounted for.

For example, active element 420 may be driven to vibrate at 1302. In some embodiments, active element 420 is driven at or near resonance. Vibrational motion of active element 420 draws the fluid through chamber 440/450 and drives fluid out through orifices 432. In some embodiments, the driving provided at 1302 allows for contact (as part of the amplitude of vibration in normal operation or as part of a crash) between active element 420 and cushion 470. At 1304, the frequency of vibration of active element 420 may be adjusted using feedback. Thus, active element 420 may be kept at or near resonance.

In another example, active element 1020 may be driven to vibrate at 1302. In some embodiments, active element 1020 is driven at or near resonance. Vibrational motion of active element 1020 draws a fluid through chamber 1040/1050 and drives fluid out through orifices 1032. In some embodiments, the driving provided at 1302 allows for contact (as part of the amplitude of vibration in normal operation or as part of a crash) between cushion 1070 of active element 1020 and orifice plate 1030. At 1304, the frequency of vibration of active element 1020 may be adjusted using feedback. Thus, active element 1020 may be kept at or near resonance.

Using method 1300, the benefits of fluid transfer systems 400, 600, 700, 800, 900, 900', 1000, 1100, 1200, and/or analogous systems may be achieved. In particular, the device with which the fluid transfer system is used may be efficiently cooled. Because crash mitigation is employed, crashes between the active element and cushion on the orifice plate, between the cushion on the active element and orifice plate, or other analogous crashes may occur but may not adversely affect performance. For example, the generation of subharmonics and/or other acoustic modes in the structure of the fluid transfer system may be reduced or eliminated. Thus, noise associated with such crashes may be reduced or eliminated. Moreover, the active element may be driven with a higher power because a gap between the cushion and the active element (or between the cushion on the active element and the orifice plate) need not be strictly maintained during operation. Thus, the amplitude of vibration of the active element may be increased over that of a system that does not employ crash mitigation. In some embodiments, fluid flow may be increased. Thus, performance of the active element and the fluid transfer system may be improved.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A fluid transfer system, comprising:
an active element having a leading edge and configured to undergo vibrational motion;
a structural element coupled with the active element; and
a cushion between the leading edge of the active element and a portion of the structural element, the cushion mitigating collisions between the portion of the structural element and the leading edge of the active element.

2. The fluid transfer system of claim 1, wherein the cushion is coupled with the leading edge of the active element.

3. The fluid transfer system of claim 1, wherein the active element includes a tip region having a portion of the leading edge; and
wherein the cushion is coupled to the structural element and a portion of the cushion is aligned with the portion of the leading edge.

4. The fluid transfer system of claim 3, wherein the structural element includes an orifice plate having a cavity therein, the cushion residing in the cavity.

5. The fluid transfer system of claim 4, wherein the cushion occupies a portion of the cavity such that a recess is between the cushion and an outer region of the orifice plate.

6. The fluid transfer system of claim 5, wherein the cushion occupies the portion of the cavity such that an additional recess is between the cushion and a central region of the orifice plate.

7. The fluid transfer system of claim 4, wherein the orifice plate includes an upper plate and a lower plate, the cavity includes an aperture in the upper plate, and the cushion is coupled with a portion of the lower plate aligned with the aperture.

8. The fluid transfer system of claim 1, wherein the active element includes a tip, wherein the structural element includes an orifice plate having a cavity therein, and wherein the tip extends over a portion of the cavity.

9. The fluid transfer system of claim 1, wherein the cushion has a Shore A hardness of not more than ninety.

10. A fluid transfer system, comprising:
a plurality of cooling cells, each of the plurality of cooling cells including a chamber having an active element therein, the active element having a leading edge and being configured to undergo vibrational motion, the chamber including a structural element; and
a plurality of cushions, a cushion of the plurality of cushions is in a cooling cell of the plurality of cooling cells, the cushion being configured to mitigate collisions between the leading edge of the active element and the structural element.

11. The fluid transfer system of claim 10, wherein the cushion is coupled with the leading edge of the active element.

12. The fluid transfer system of claim 10, wherein the active element includes a tip region having a portion of the leading edge; and wherein the cushion is coupled to the structural element and a portion of the cushion is aligned with the portion of the leading edge.

13. The fluid transfer system of claim 12, wherein the structural element includes an orifice plate having a cavity therein, the cushion residing in the cavity.

14. The fluid transfer system of claim 13, wherein the cushion occupies a portion of the cavity such that a recess is between the cushion and an outer region of the orifice plate.

15. The fluid transfer system of claim 14, wherein the cushion occupies the portion of the cavity such that an additional recess is between the cushion and a central region of the orifice plate.

16. The fluid transfer system of claim 13, wherein the orifice plate includes an upper plate and a lower plate, the cavity includes an aperture in the upper plate, and the cushion is coupled with a portion of the lower plate aligned with the aperture.

17. The fluid transfer system of claim 10, wherein the active element includes a tip, wherein the structural element includes an orifice plate having a cavity therein, and wherein the tip extends over a portion of the cavity.

* * * * *